United States Patent
Luo et al.

(10) Patent No.: US 11,043,035 B2
(45) Date of Patent: Jun. 22, 2021

(54) METHODS AND SYSTEMS FOR SIMULATING IMAGE CAPTURE IN AN EXTENDED REALITY SYSTEM

(71) Applicant: Verizon Patent and Licensing Inc., Arlington, VA (US)

(72) Inventors: Liang Luo, Piscataway Township, NJ (US); Denny Breitenfeld, Florham Park, NJ (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 0 days.

(21) Appl. No.: 16/587,423

(22) Filed: Sep. 30, 2019

(65) Prior Publication Data

US 2021/0097763 A1    Apr. 1, 2021

(51) Int. Cl.
| | |
|---|---|
| *G06F 15/80* | (2006.01) |
| *G06T 19/00* | (2011.01) |
| *G06T 7/73* | (2017.01) |
| *G06T 15/20* | (2011.01) |
| *G06T 17/00* | (2006.01) |
| *G06K 9/00* | (2006.01) |
| *G06F 30/20* | (2020.01) |

(52) U.S. Cl.
CPC ............ *G06T 19/006* (2013.01); *G06F 30/20* (2020.01); *G06K 9/00671* (2013.01); *G06T 7/74* (2017.01); *G06T 15/20* (2013.01); *G06T 17/00* (2013.01)

(58) Field of Classification Search
CPC ....... G06T 15/20; G06T 15/08; G06T 15/205; G06T 2207/10028; G06T 19/006; G06T 2207/30241; G06T 3/4053; H04N 13/282; H04N 13/111; H04N 13/156; H04N 13/25; H04N 21/21805; G06F 3/04815; G06F 3/011
See application file for complete search history.

(56) References Cited

U.S. PATENT DOCUMENTS

| | | | |
|---|---|---|---|
| 2016/0205341 A1* | 7/2016 | Hollander | H04N 7/015 375/240.08 |
| 2019/0045157 A1* | 2/2019 | Venshtain | G06T 7/75 |
| 2020/0162643 A1* | 5/2020 | Park | H04N 5/2224 |

\* cited by examiner

*Primary Examiner* — Hau H Nguyen

(57) ABSTRACT

An exemplary image simulation system accesses an image depicting imagery captured at a capture resolution from a capture vantage point. The image simulation system partitions the image into a plurality of simulated images, and determines a respective virtual resolution and a respective virtual vantage point for each of the simulated images in the plurality of simulated images. Each virtual resolution determined by the image simulation system is different from the capture resolution and each virtual vantage point determined by the image simulation system is different from the capture vantage point. The image simulation system represents each simulated image of the plurality of simulated images as a distinct image captured at the respective virtual resolution and from the respective virtual vantage point that have been determined for the simulated image. Corresponding methods and systems are also disclosed, including methods and systems for combining captured images to form a single simulated image.

20 Claims, 13 Drawing Sheets

METHODS AND SYSTEMS FOR SIMULATING IMAGE CAPTURE IN AN EXTENDED REALITY SYSTEM

BACKGROUND INFORMATION

Extended reality technologies (e.g., virtual reality technology, augmented reality technology, mixed reality technology, etc.) allow users to experience extended reality worlds in a variety of entertainment, educational, vocational, and other enjoyable and/or valuable types of applications. In certain examples, extended reality worlds may be implemented as partially or fully simulated realities that are based on real world places and objects that are captured and represented using the extended reality technologies (e.g., because experiencing these real world places and objects in a non-simulated manner may be difficult, inconvenient, expensive, or otherwise problematic). For instance, in at least some such examples, real world places and objects may be captured and represented in real time so as to allow the places and objects to be experienced live as events occur in the real world.

In order to provide such extended reality media content, specific architectures may be deployed for capturing real-world imagery and processing the imagery to generate the extended reality media content. In such extended reality architectures, as well as in other use cases in which real-world imagery is captured, it is desirable for image capture to be performed as efficiently, effectively, and flexibly as possible.

BRIEF DESCRIPTION OF THE DRAWINGS

The accompanying drawings illustrate various embodiments and are a part of the specification. The illustrated embodiments are merely examples and do not limit the scope of the disclosure. Throughout the drawings, identical or similar reference numbers designate identical or similar elements.

DETAILED DESCRIPTION OF PREFERRED EMBODIMENTS

Figure 1:
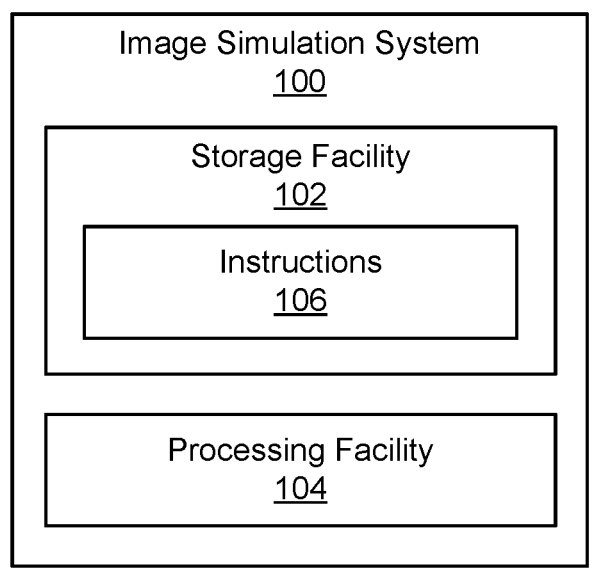
FIG. 1 illustrates an exemplary image simulation system for simulating image capture in an extended reality system according to embodiments described herein.

Methods and systems for simulating image capture in an extended reality system are described herein. In various scenarios, images are captured by physical capture devices (e.g., cameras or other image capture devices, depth capture devices, etc.) to be used to generate content presented to viewers. For example, captured images may be incorporated into extended reality media content (e.g., virtual reality media content, augmented reality media content, etc.) presented to users of extended reality media player devices as they experience extended reality worlds based on the captured images. As will be described in detail herein, it may be desirable, either for these types of extended reality examples or for other image capture use cases, for there to be flexibility in how images are captured by physical devices. Accordingly, methods and systems described herein for simulating image capture at a virtual resolution from a virtual vantage point may serve to decouple physical capture devices from various aspects of the images that the devices capture. For example, a first number of images may be captured using the first number of physical capture devices disposed at particular vantage points. Based on this first number of images, methods and systems described herein may produce a second number of images (i.e., where the second number is different from the first number) that are represented as being taken from virtual vantage points different from the actual vantage points.

As one example, for instance, a relatively high-resolution image capture device could capture a single image that is converted into a plurality of lower-resolution images that are presented as if captured from different vantage points. More specifically, for example, an exemplary image simulation system may access an image depicting imagery captured at a capture resolution from a capture vantage point. The system may then partition the image into a plurality of simulated images and determine a respective virtual resolution and a respective virtual vantage point for each of the simulated images in the plurality of simulated images. Each virtual resolution determined by the system may be different from the capture resolution and each virtual vantage point determined by the system may be different from the capture vantage point. Accordingly, the system may represent (e.g., provide, present, store, etc.) each simulated image of the plurality of simulated images as a distinct image captured at the respective virtual resolution and from the respective virtual vantage point that have been determined for the simulated image.

As another example, a plurality of relatively low-resolution image capture devices could capture images that are collectively presented as a single higher-resolution image captured from a different vantage point. More specifically, for instance, an exemplary image simulation system may access a plurality of images depicting imagery captured at respective capture resolutions from respective capture vantage points. The system may then combine the plurality of images to form a single simulated image, and determine a virtual resolution and a virtual vantage point for the simulated image. The virtual resolution determined by the system may be different from each of the respective capture resolutions, and the virtual vantage point determined by the system may be different from each of the respective capture vantage points. Accordingly, the system may represent the simulated image as a single image captured at the virtual resolution and from the virtual vantage point that have been determined for the simulated image.

Methods and systems described herein for simulating image capture at a virtual resolution from a virtual vantage point may provide various benefits and advantages. For example, by decoupling images and certain characteristics thereof (e.g., the resolution of the images, the vantage points from which the images are captured, etc.) from physical capture devices used to capture the images, the technologies described herein allow for more flexible and efficient usage of various types of system resources (e.g., physical capture devices, data processing systems and components thereof, etc.) in various configurations and use cases.

As one example, as camera resolutions continue to climb to higher resolutions, the amount of data captured in a single high-resolution image may exceed the processing capabilities of any single existing computing device (or any computing device that is available by use of a particular application) in accordance with certain temporal parameters (e.g., parameters that would make the processing occur in real time). Accordingly, methods and systems described herein may provide efficient and convenient ways for such high-resolution images to be divided so as to be processed by computing devices that are more readily available (e.g., parallel computing devices that process in real time for certain applications, one or more computing devices that process the data more sequentially and/or with a delay in other applications, etc.). For instance, if an image having approximately 12,000 lines of pixels (a "12K image") contains too much data for a particular server to process in real time, methods and systems described herein may allow the 12K image to be converted into four images each having approximately 6,000 lines of pixels ("6K images") that may be processed, in parallel and in real time, by four separate servers. As will be described in more detail below, this flexibility may be particularly advantageous when image capture systems utilizing the image simulation systems and methods described herein are integrated with certain network architectures such as modular network architectures that will be described in more detail below.

As another example, it may be desirable, in certain situations, to place a relatively high-resolution capture device at a particular vantage point, but this may not be possible or practical for various reasons. For instance, the desired vantage point may not be available for placing a physical capture device, or a physical capture device with the desired resolution may not be available. In this type of scenario, methods and systems described herein may advantageously allow for a plurality of physical capture devices located at vantage points other than the desired (unavailable) vantage point to be used to generate a simulated high-resolution image from the desired vantage point.

As yet another benefit, the decoupling of physical capture device characteristics and image characteristics provided by methods and systems described herein may allow physical capture devices to be used more flexibly in various architectures and use cases. For instance, if an architecture is configured to take in images having approximately 4,000 lines of pixels ("4K images") from a plurality of image capture systems, but some available physical capture devices are configured to capture images having approximately 8,000 lines of pixels ("8K images") or approximately 1,000 lines of pixels ("high-definition ('HD') images"), rather than capturing 4K images, methods and systems described herein may allow for 4K virtual image capture systems to be formed from the devices having higher or lower resolutions than the requisite 4K resolution of this example.

Various embodiments will now be described in more detail with reference to the figures. The disclosed methods and devices may provide one or more of the benefits mentioned above and/or various additional and/or alternative benefits that will be made apparent herein.

FIG. 1 illustrates an exemplary image simulation system 100 ("system 100") for simulating image capture in an extended reality world. As shown, system 100 may include, without limitation, a storage facility 102 and a processing facility 104 selectively and communicatively coupled to one another. Facilities 102 and 104 may each include or be implemented by hardware and/or software components (e.g., processors, memories, communication interfaces, instructions stored in memory for execution by the processors, etc.). In some examples, facilities 102 and 104 may be distributed between multiple computing devices or systems (e.g., multiple servers, etc.) and/or between multiple locations as may serve a particular implementation. Each of facilities 102 and 104 within system 100 will now be described in more detail.

Storage facility 102 may store and/or otherwise maintain executable data used by processing facility 104 to perform any of the functionality described herein. For example, storage facility 102 may store instructions 106 that may be executed by processing facility 104. Instructions 106 may be executed by processing facility 104 to perform any of the functionality described herein, and may be implemented by any suitable application, software, code, and/or other executable data instance. Additionally, storage facility 102 may also maintain any other data accessed, managed, generated, used, and/or transmitted by processing facility 104 in a particular implementation.

Processing facility 104 may be configured to perform (e.g., execute instructions 106 stored in storage facility 102 to perform) various functions associated with simulating image capture at a virtual resolution from a virtual vantage point. For example, in certain implementations of system 100, processing facility 104 may transform an image captured at a particular capture resolution from a particular capture vantage point into a plurality of simulated images that are represented as having been captured at different resolutions (e.g., reduced resolutions from the original capture resolution) from different vantage points. More specifically, processing facility 104 may be configured, in this type of implementation, to access an image depicting imagery captured at a capture resolution from a capture vantage point, and to partition the image into a plurality of simulated images. Processing facility 104 may determine a respective virtual resolution and a respective virtual vantage point for each of the simulated images in the plurality of simulated images. In particular, each virtual resolution determined by processing facility 104 may be different from the capture resolution and each virtual vantage point determined by processing facility 104 may be different from the capture vantage point. Based on this processing, processing facility 104 may represent each of the simulated images (e.g., as the simulated images are stored, used, transmitted to other systems, etc.) as a distinct image captured at the respective virtual resolution and from the respective virtual vantage point that have been determined for the simulated image.

As another example, in the same or other implementations of system 100, processing facility 104 may transform a plurality of images captured at one or more capture resolutions from a plurality of particular capture vantage points into a single simulated image that is represented as having been captured at a different resolution (e.g., a higher resolutions than the original capture resolution(s)) from a different vantage point. More specifically, processing facility 104 may be configured, in this type of implementation, to access a plurality of images depicting imagery captured at respective capture resolutions from respective capture vantage points, and to combine the plurality of images to form a single simulated image. Processing facility 104 may determine a virtual resolution and a virtual vantage point for the single simulated image. In particular, the virtual resolution determined by processing facility 104 may be different from each of the respective capture resolutions and the virtual vantage point determined by processing facility 104 may be different from each of the respective capture vantage points. Based on this processing, processing facility 104 may represent the simulated image (e.g., as the simulated image is stored, used, presented, transmitted to other systems, etc.) as a single image captured at the virtual resolution and from the virtual vantage point that have been determined for the simulated image.

In some examples, system 100 may be configured to operate in real time so as to provide, receive, process, and/or use the data described above (e.g., captured images, simulated images, etc.) immediately as the data is generated, updated, changed, or otherwise becomes available. As a result, system 100 may simulate image capture at a virtual resolution from a virtual vantage point based on relevant, real-time data so as to allow downstream processing of the simulated images (e.g., by data processing systems and media player devices and so forth that will be described in more detail below) to occur immediately and responsively to other things happening in the overall system. For example, if the simulated images are used to generate real-time extended reality media content to be experienced by a user, system 100 may operate in real time so as to allow the user to virtually experience an event that is occurring in the real world as the event is occurring.

As used herein, operations may be performed in "real time" when they are performed immediately and without undue delay. In some examples, real-time data processing operations may be performed in relation to data that is highly dynamic and time sensitive (i.e., data that becomes irrelevant after a very short time). As such, real-time operations may simulate image capture at a virtual resolution from a virtual vantage point based on captured data that is relevant and up-to-date.

An image simulation system such as system 100 may be configured to interoperate with any suitable type and/or number of physical capture devices to form one or more image capture systems. As used herein, a "physical capture device" may refer to a discrete or standalone physical device configured to capture image data representative of object surfaces (e.g., color data, depth data, etc.). For example, physical capture devices may include photo cameras, video cameras, light field cameras, and other types of image capture devices as may serve a particular implementation. Similarly, as used herein, an "image capture system" may present as a discrete source of image data (i.e., by providing image data captured from a particular vantage point, etc.) and may, in certain examples, be implemented by a single physical capture device. However, as will be described in more detail below, image capture systems are different from physical capture devices in the sense that image capture systems are not tied to underlying physical hardware in any particular way. For example, one physical capture device may correspond to (e.g., capture image data that is to be provided by) multiple image capture systems, or multiple physical capture devices may correspond to (e.g., capture image data that is to be provided by) a single image capture system. Whatever the relationship between physical capture devices and image capture systems in a particular implementation, image capture systems may be used to capture and provide image data to other systems for exemplary purposes that will be described in more detail below.

Figure 2:
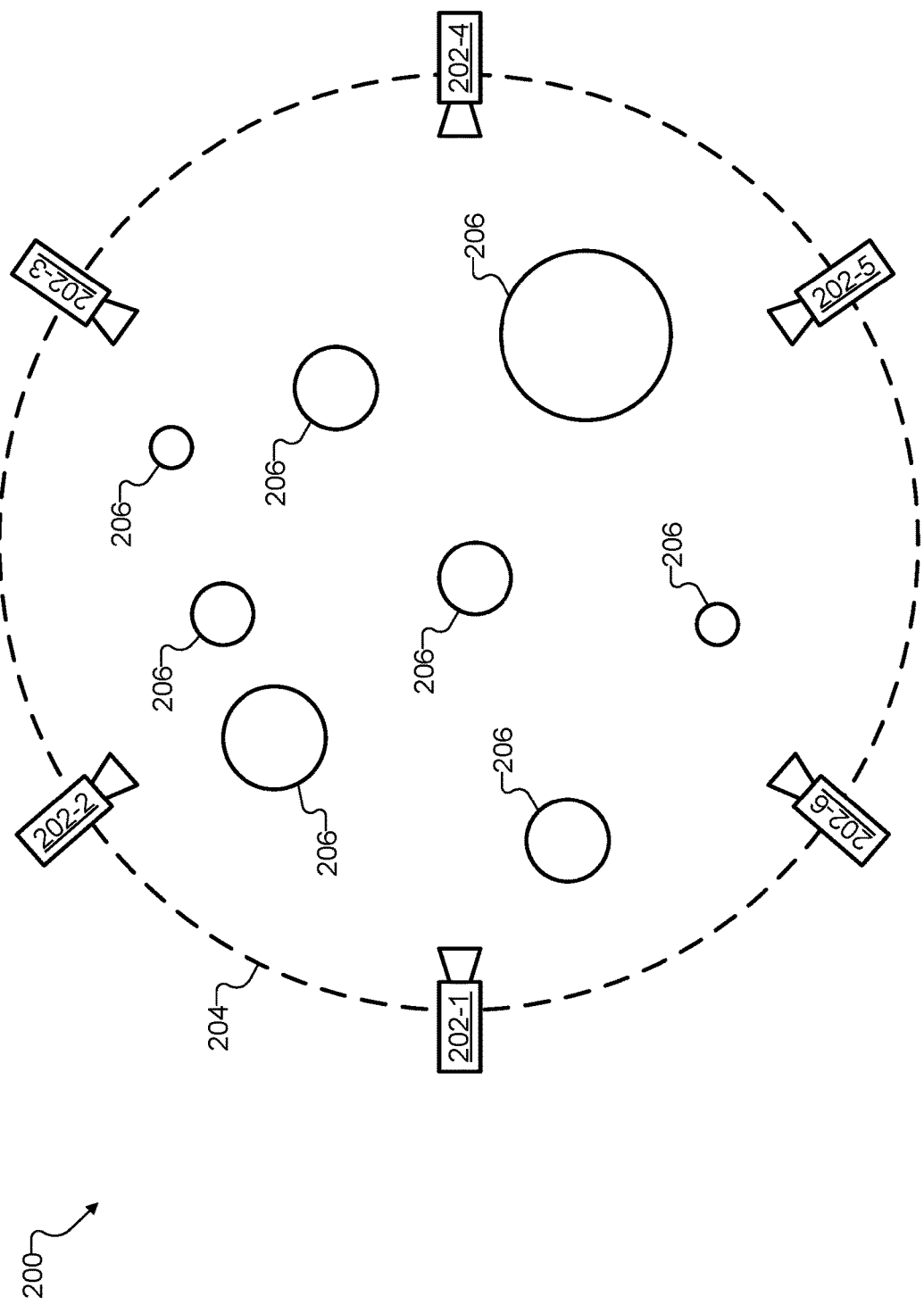
FIG. 2 illustrates an exemplary capture configuration in which an exemplary set of image capture systems is disposed at different vantage points with respect to a capture area according to embodiments described herein.

To illustrate the context in which image capture by image capture systems may be performed, FIG. 2 shows an exemplary capture configuration 200 in which an exemplary set of image capture systems 202 (e.g., image capture systems 202-1 through 202-6) is disposed at different vantage points with respect to a capture area 204. Each image capture system 202 may capture, from a respective vantage point with respect to capture area 204, surface data such as color data (i.e., how surface points appear in either color or grayscale) and/or depth data (i.e., where surface points are located with respect to a vantage-point-specific coordinate system or world coordinate system). Additionally, each image capture system 202 may generate additional data (e.g., metadata indicative of the vantage point from which surface data is captured, etc.) to be provided to downstream data processing systems together with the surface data.

While each respective vantage point of image capture systems 202 is shown in FIG. 2 to be represented as a different capture location and orientation (i.e., the angle the image capture systems are pointing) with respect to capture area 204, it will be understood that additional aspects besides the capture location and orientation may define a particular vantage point, including, but not limited to, a zoom level of the image capture system, a resolution at which the image capture system captures imagery, intrinsic parameters associated with the image capture system (e.g., how wide angle of a lens is being used), and so forth.

Capture area 204 may represent any real-world area or region that may be captured by a set of image capture systems such as image capture systems 202. For example, capture area 204 may be a relatively small area (e.g., a single room or smaller) or a relatively large area (e.g., a playing field of a professional sports stadium or larger). Capture area 204 may take any shape or form (e.g., the circular shape shown in FIG. 2, a square or rectangular shape, an irregular shape, etc.), including a single continuous area or a collection of unconnected areas. Additionally, capture area 204 may be associated with an event that is ongoing (e.g., a sporting event, a concert, a festival or party, etc.) in any indoor area, outdoor area, or combination area that includes indoor and outdoor regions.

As shown, various objects 206 are included within capture area 204. While, for sake of illustration, objects 206 are depicted as different sized circles, it will be understood that each object 206 may represent any type of animate or inanimate object of any shape or size as may serve a particular implementation. For instance, if capture area 204 includes a football stadium, objects 206 may represent the players on each team, the football, the goal posts, the referees, and so forth. As another example, if capture area 204 includes a stage where a concert is taking place, objects 206 may represent musicians, musical instruments, microphones, and the like. Accordingly, each object 206 will be understood to be any type of real-world object that is visible or detectable in capture area 204 and that is to be represented within extended reality media content that is to be generated as a result of the volumetric data processing.

Figure 3:
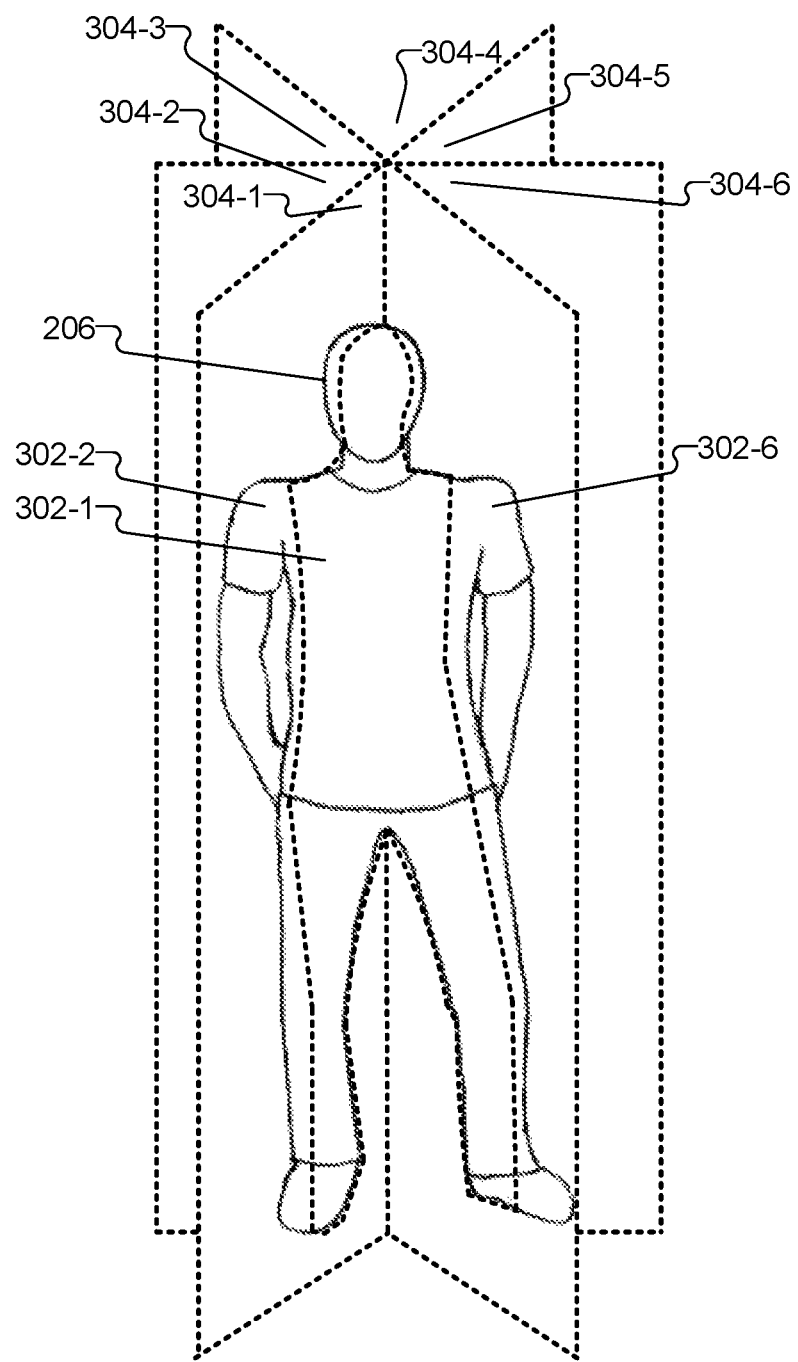
FIG. 3 illustrates exemplary aspects of how surface data representative of an exemplary object is captured from different vantage points according to embodiments described herein.

Image capture systems 202 may capture surface data about each object 206 from all the different vantage points shown in FIG. 2. To illustrate exemplary aspects of how surface data representative of an exemplary object is captured from different vantage points according to embodiments described herein, a particular object 206 will be considered. Specifically, FIG. 3 shows an object 206 that is, in this example, a person present in capture area 204. Accordingly, this particular object 206 will also be referred to as "person 206."

In FIG. 3, person 206 is shown at a moment when the surface of person 206 is captured from the vantage points of image capture systems 202 in FIG. 2. As with any three-dimensional ("3D") object, an external surface of person 206 may be divided into a plurality of regions that correspond to the different vantage points of the image capture systems 202 capturing the surface data representing the surface. For instance, a first region may correspond to a first vantage point because points in the region are closer to the first vantage point than any other vantage point, are more visible from the first vantage point than from any other vantage point, or the like.

Specifically, as shown, a surface 302 of person 206 may be divided in regions 304 (e.g., regions 304-1 through 304-6) according to which parts of surface 302 fall within which region 304. In FIG. 3, each portion of the overall surface 302 of person 206 included in a different region 304 is labeled as surface portion 302-X, where X indicates the region 304 of that portion of the surface. Accordingly, as shown, surface portion 302-1 is a portion of overall surface 302 that is best captured from a vantage point associated with region 304-1 (e.g., the vantage point of image capture system 202-1), surface portion 302-2 is a portion of overall surface 302 that is best captured from a vantage point associated with region 304-2 (e.g., the vantage point of image capture system 202-2), and surface portion 302-6 is a portion of overall surface 302 that is best captured from a vantage point associated with region 304-6 (e.g., the vantage point of image capture system 202-6). Other surface portions 302-3 through 302-5 are not explicitly shown or labeled in FIG. 3, but will be understood to be present on the back side of person 206 that is occluded from the viewpoint associated with FIG. 3.

In the context of the image capture operations described above in relation to FIGS. 2 and 3, system 100 may be used to form one or more image capture systems such as image capture systems 202 based on surface data (i.e., color image data, depth image data, etc.) captured by one or more physical capture devices. As described above, such image capture systems may present as independent, discrete systems that each provide image data to downstream data processing resources of an image capture and processing architecture, and system 100 may advantageously form a number of image capture systems that does not necessarily match the number of physical capture devices capturing the image data. Rather, in some examples, system 100 may use a single physical capture device (e.g., a relatively high-resolution physical capture device) to form a plurality of corresponding image capture systems, or system 100 may use a group of physical capture devices (e.g., relatively low-resolution physical capture devices) to form single image capture systems.

Figure 4:
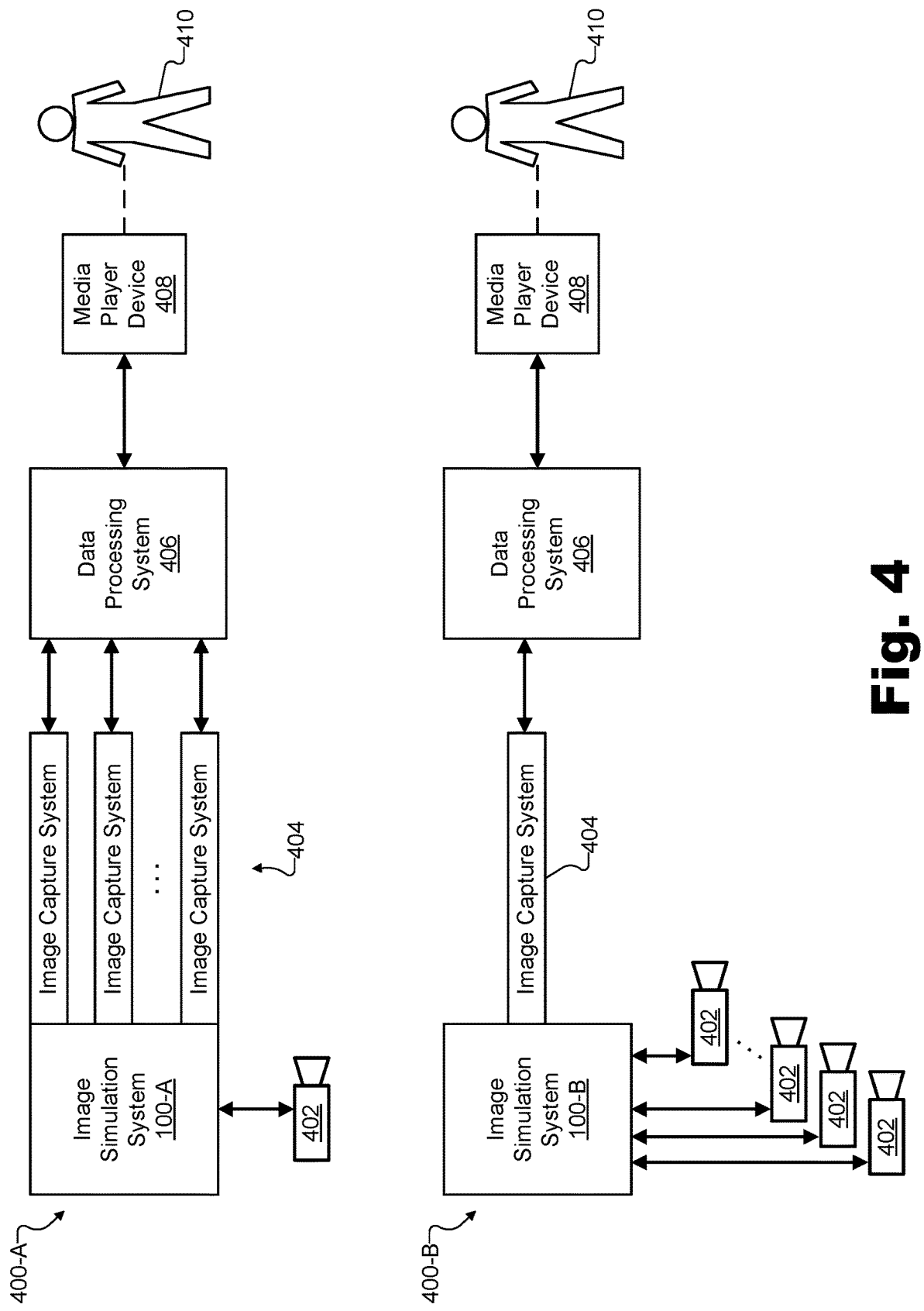
FIG. 4 illustrates exemplary configurations in which the image simulation system of FIG. 1 is configured to operate according to embodiments described herein.

To illustrate, FIG. 4 shows two exemplary configurations 400 (i.e., configurations 400-A and 400-B) in which system 100 is configured to operate. As shown, system 100 is labeled as image simulation system 100-A in the implementation of configuration 400-A, and is labeled as image simulation system 100-B in the implementation of configuration 400-B. As such, it will be understood that these implementations of system 100 may be different from one another (or a single implementation of system 100 may be operating in a different mode or the like) in the ways described below. In each of configurations 400, the respective implementation of system 100 is communicatively coupled to a number of physical capture devices 402 (i.e., a single physical capture device 402 in configuration 400-A and a plurality of physical capture devices 402 in configuration 400-B) and uses image data captured by the physical capture device(s) 402 to form a number of image capture systems 404 (i.e., a plurality of image capture systems 404 in configuration 400-A and a single image capture system 404 in configuration 400-B). While physical capture devices 402 are shown to be separate from and communicatively coupled with the implementations of system 100 in FIG. 4, it will be understood that, in certain embodiments, an implementation of system 100 may incorporate one or more physical capture devices 402 as components of system 100. Additionally, it will be understood that, in configurations not explicitly shown, other numbers and combinations of physical capture devices 402 and image capture systems 404 may also be implemented, such as a first plurality of physical capture devices 402 that is used to form a second plurality (i.e., having a different number than the first plurality) of image capture systems 404. As further shown in both configurations 400, the image capture system(s) 404 each provide image data to a data processing system 406 that, in turn, provides data (e.g., data representative of extended reality media content or the like) to a media player device 408 used by a user 410.

System 100 has been described in detail above and will be understood to be implemented within configurations 400 in any suitable way and/or by any suitable hardware and software. For instance, system 100 may be integrated in hardware implementing one or more of physical capture devices 402, integrated into data processing system 406 or a component thereof, implemented as a standalone or independent computing system communicatively coupled to physical capture device(s) 402 and data processing system 406, or implemented in any other suitable manner as may serve a particular implementation. The exemplary implementations of system 100 (i.e., image simulation systems 100-A and 100-B) will now be described, together with detail regarding how such implementations interoperate with other components of configurations 400, with reference to FIGS. 4-9.

As shown in FIG. 4, image simulation system 100-A of configuration 400-A may be configured to access image data from a single physical capture device 402, and to form a plurality of image capture systems 404. As mentioned above, physical capture device 402 may be implemented as any image capture unit (e.g., a device with a single image sensor, etc.) that is configured to capture images at a particular capture resolution and from a particular capture vantage point. For example, physical capture device 402 may include or be implemented by a discrete camera (e.g., a digital photo camera, a digital video camera, etc.) configured to capture light intensity at any suitable resolution. As another example, physical capture device 402 may include or be implemented by a light field camera configured to capture the intensity and direction that light rays travel using an array of small lenses providing light to a single image sensor or using a multi-camera array that is configured to generate a light-field image of a subject. In some examples, physical capture device 402 may also include or be implemented by a depth capture device configured to capture depth values indicative of the respective locations of various surface points on a surface of an object being captured. For instance, depth capture devices may operate based on stereoscopic depth detection principles, time-of-flight depth detection principles, or any other suitable depth detection principles to generate an image in which different shades or colors represent different depths or locations.

One reason that image simulation system 100-A may access image data from only one physical capture device 402 is that the physical capture device 402 may provide capture data with a resolution that is so high that it may be impractical, inconvenient, or impossible for components of data processing system 406 to process the images captured thereby in their original form. Accordingly, in this example, image simulation system 100-A may access the image by capturing the image at the capture resolution using the single physical capture device 402, and may represent each simulated image as a distinct image by forming the plurality of image capture systems 404 to correspond to the single physical capture device 402 and to each provide a different simulated image of the plurality of simulated images.

Figure 5:
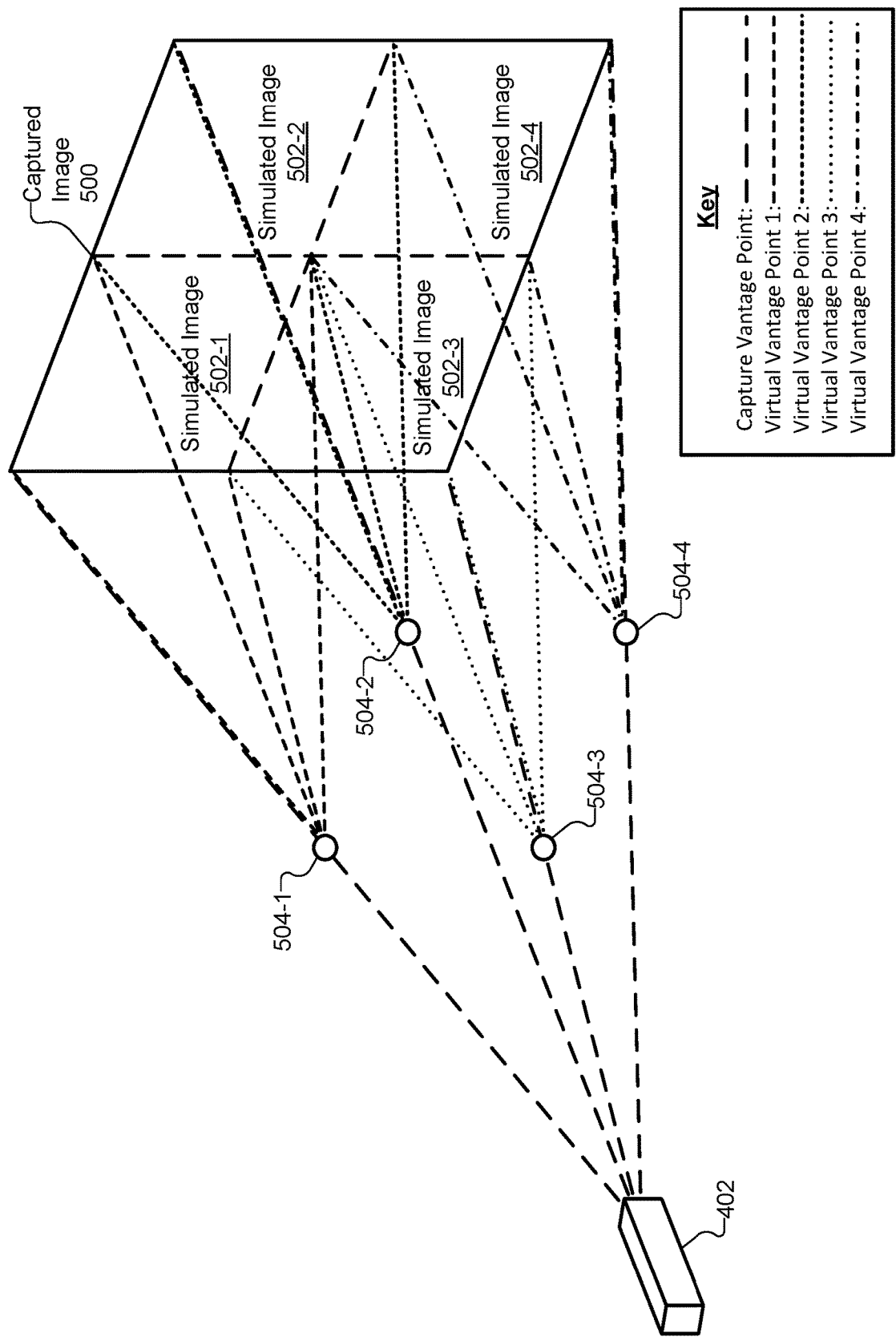
FIG. 5 illustrates an exemplary image captured from a capture vantage point and partitioned into an exemplary plurality of simulated images associated with virtual vantage points according to embodiments described herein.

To illustrate how this may be performed, FIG. 5 shows an exemplary image captured from a capture vantage point and partitioned into an exemplary plurality of simulated images associated with virtual vantage points according to principles described herein. Specifically, as depicted in FIG. 5, the single physical capture device 402 of configuration 400-A is shown to capture a captured image 500 from a capture vantage point illustrated by a dashed line of the style indicated by the Key of FIG. 5. Moreover, FIG. 5 shows that system 100 may partition captured image 500 into a plurality of simulated images 502 (e.g., simulated images 502-1 through 502-4) that are each associated with respective virtual capture devices 504 (e.g., virtual capture devices 504-1 through 504-4) associated with their own respective virtual vantage points illustrated by dashed lines of different styles also indicated by the Key. For example, virtual capture device 504-1 may be associated with "Virtual Vantage Point 1" in the Key, virtual capture device 504-2 may be associated with "Virtual Vantage Point 2" in the Key, and so forth. As shown, the capture vantage point from which physical capture device 402 captures captured image 500 is associated with a spatial location that is farther away from imagery depicted in captured image 500 than the spatial locations of the respective virtual vantage points of virtual capture devices 504.

As used herein, a "virtual capture device" such as each of virtual capture devices 504 may refer to any image capture unit that is not physical (such as a physical camera or other physical capture device described herein) but that otherwise may provide image data and be treated as if it were a physical capture device. For example, like a physical capture device, a virtual capture device may provide images (referred to as "simulated images") that appear to be captured at a virtual resolution (e.g., a resolution different from the capture resolution of the physical capture device(s) that physically captured the data) and that appear to be captured from a virtual vantage point (e.g., a vantage point different from the capture vantage point(s) from which the data was physically captured). Accordingly, as shown in FIG. 5 (and as will be further illustrated below in relation to FIG. 7), the number of virtual capture devices and the number of physical capture device in a given example may not match up one to one. For example, the number of virtual capture devices 504 (i.e., 4) is greater than the number of physical capture devices 402 (i.e., 1) in the example of FIG. 5, while the number of physical capture devices 402 (i.e., 4) will be shown to be greater than the number of virtual capture devices 504 (i.e., 1) in the example of FIG. 7 described below.

The partitioning of captured image 500 into simulated images 502 may be performed in any suitable way to form simulated images 502 with any suitable resolutions (e.g., a resolution small enough to be conveniently processable by downstream systems such as data processing system 406). For instance, as shown in FIG. 5, the partitioning of captured image 500 into the plurality of simulated images 502 may include dividing captured image 500 along horizontal and vertical grid lines that divide the image into an equal number of rows and columns (e.g., two rows and two columns in this example for a total of four simulated images 502). In such examples, it may be desirable for each row to have a substantially equal height and each column to have a substantially equal width so that each simulated image 502 will be the same size as the other simulated images 502 and will have the same aspect ratio as both captured image 500 and the other simulated images 502.

Figure 6:
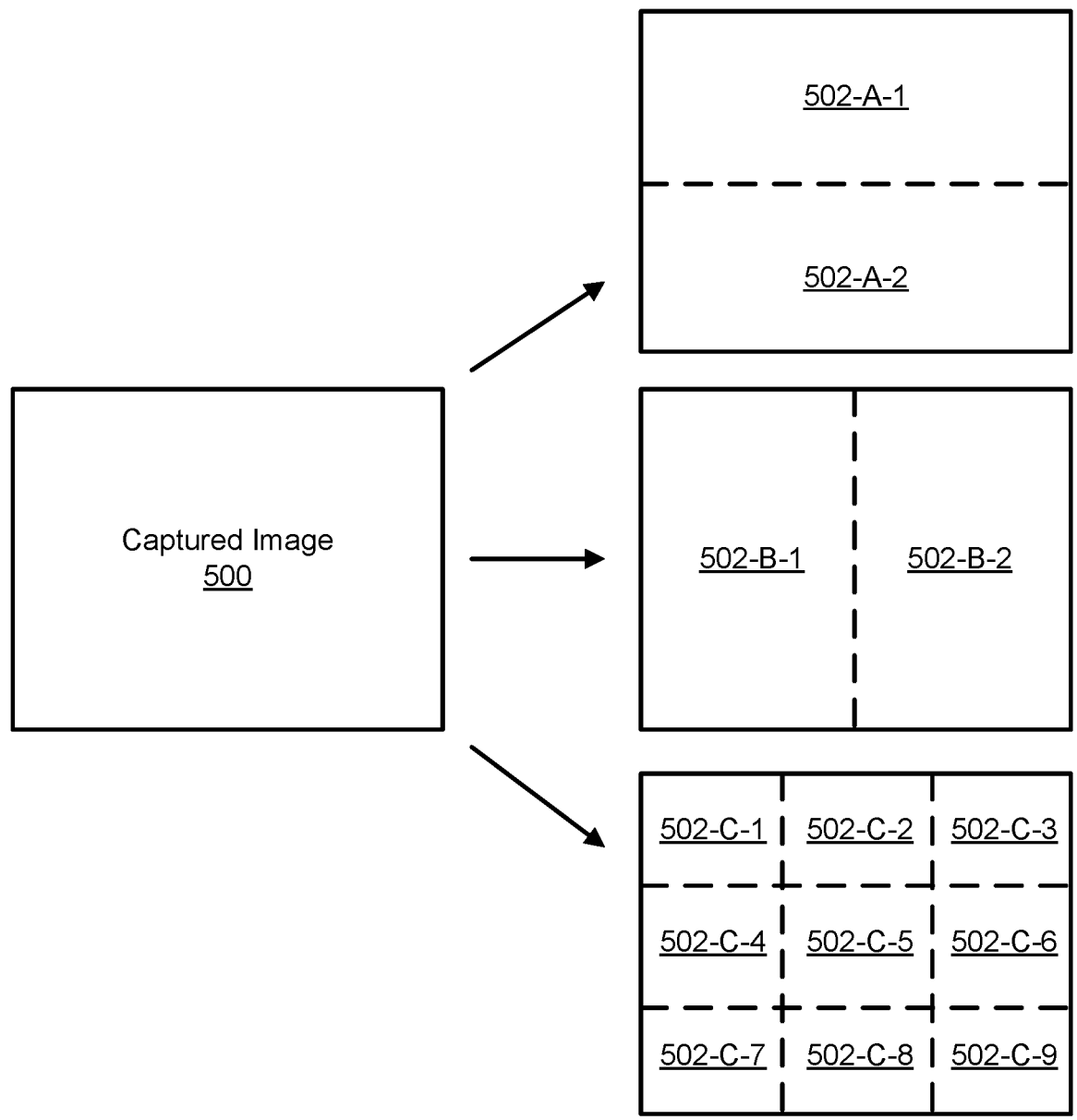
FIG. 6 illustrates various exemplary ways that a captured image may be partitioned into a plurality of simulated images according to embodiments described herein.

In certain examples, partitioning may also be done in a variety of ways different than shown in FIG. 5. For instance, FIG. 6 shows various exemplary ways that captured image 500 may be partitioned into a plurality of simulated images 502. In some of these examples, the number of rows and columns into which captured image 500 is divided is unequal and/or the respective heights and widths of the rows and columns are unequal such that simulated images 502 have different resolutions and/or aspect ratios than one another and/or than captured image 500. For example, simulated images 502 labeled as simulated images 502-A (i.e., simulated images 502-A-1 and 502-A-2) are shown to be partitioned by dividing captured image 500 into two rows but keeping a single column (i.e., so as to create a total of two simulated images 502-A). As another example, simulated images 502 labeled as simulated images 502-B (i.e., simulated images 502-B-1 and 502-B-2) are shown to be partitioned by dividing captured image 500 into two columns but keeping a single row (i.e., so as to create a total of two simulated images 502-B).

In other examples, as mentioned above with the four simulated images into which captured image 500 is partitioned in FIG. 5, the number of rows and columns may be the same, so as to create a perfect square (e.g., 4, 9, 16, 25, etc.) number of simulated images. Simulated images 502 labeled as simulated images 502-C (i.e., simulated images 502-C-1 through 502-C-9) provide another example of this type of scenario, in this case partitioning captured image 500 into three columns and three rows so as to create a total of nine simulated images 502-C.

While many examples described herein relate to a captured image 500 that is captured by a single capture device (e.g., physical capture device 402), it will also be understood that system 100 may simulate image capture in the ways illustrated in FIGS. 5 and 6 starting with an image that has been generated in a manner other than being captured by a single physical capture device. For example, the starting image accessed by system 100 (i.e., the image represented by captured image 500 in FIGS. 5 and 6) may have been generated by a previous partitioning of an even larger captured image, by a previous combining of multiple smaller captured images, virtually generated (i.e., rather than physically captured), or created in any other way as may serve a particular implementation.

Returning to FIG. 5, after system 100 has partitioned captured image 500 into simulated images 502, system 100 may determine the respective virtual resolution of each simulated image 502 and the respective virtual vantage point for each simulated image 502 (e.g., including the spatial location of the respective virtual capture devices 504 that could have captured the simulated images 502).

To this end, system 100 may determine the virtual vantage points of virtual capture devices 504 in any manner as may serve a particular implementation. For instance, in certain examples, physical capture device 402 may be associated with a set of capture parameters (e.g., intrinsic parameters, extrinsic parameters, etc.) that define which imagery is depicted in captured image 500. In such examples, the determining of the respective virtual vantage point for a particular simulated image 502 may include 1) converting the set of capture parameters to an additional set of capture parameters distinct from the set of capture parameters (e.g., an additional set of capture parameters that corresponds to the respective virtual capture device 504 that would be capable of capturing imagery depicted in the particular simulated image 502), and 2) defining the respective virtual vantage point for the particular simulated image 502 based on the additional set of capture parameters.

Any type of capture parameters may be used in any suitable manner to define the respective virtual vantage point. For example, if a set of intrinsic parameters is known for physical capture device 402, one or more projection matrices may be used to convert these intrinsic parameters to intrinsic parameters of a virtual capture device 504 that would capture a respective simulated image 502. Similarly, if a set of extrinsic parameters is known for the capture vantage point of physical capture device 402 (e.g., with respect to a world coordinate system), one or more projection matrices may be used to convert these extrinsic parameters to extrinsic parameters for a virtual vantage point of the virtual capture device 504 at the location shown in FIG. 5. Ultimately, then, system 100 may determine (and generate metadata representative of) simulated capture parameters that include virtual intrinsic parameters for a virtual capture device 504 that would capture each simulated image 502, as well as virtual extrinsic parameters for where each such virtual capture device would be placed in world space (i.e., in relation to the world coordinate system) to capture the respective simulated image 502.

In other examples, system 100 may not convert or transform capture parameters, but, rather, may maintain the intrinsic and extrinsic parameters of physical capture device 402 and determine and generate metadata representative of regional pixel information indicating which pixels of captured image 500 are included within a particular simulated image 502.

Once system 100 determines the respective virtual resolution and the respective virtual vantage point for each of the simulated images 502, system 100 may represent each simulated image 502 as a distinct image captured at the respective virtual resolution and from the respective virtual vantage point that have been determined. For example, system 100 may represent simulated image 502-1 as a distinct image captured at a resolution with half as many rows of pixels and half as many columns of pixels as the resolution of captured image 500 and captured from the virtual vantage point of virtual capture device 504-1. This may be done by generating metadata that is to be provided together with (e.g., transmitted together with, stored together with, or otherwise associated with) data representative of simulated image 502-1 and that defines the virtual vantage point of virtual capture device 504-1 with respect to a world coordinate system common to each of simulated images 502. System 100 may similarly generate and associate corresponding metadata with each of simulated images 502-2 through 502-4.

Returning to FIG. 4, configuration 400-B illustrates the implementation of system 100 labeled image simulation system 100-B, and, as shown, is configured to interoperate with a plurality of physical capture devices 402 to form a single image capture system 404. One reason that image simulation system 100-B may access image data from the plurality of physical capture devices 402 is that each physical capture device 402 may provide capture data with a resolution that is lower than may be practical or convenient for data processing system 406 to process in its original form. For instance, data processing system 406 may be configured to process images having 4K resolution and each physical capture device 402 may be configured to capture images at an HD resolution lower than the 4K resolution. Accordingly, in this example, image simulation system 100-B may access the plurality of images by capturing the plurality of image at the respective capture resolutions using the plurality of physical capture devices 402, and may represent the simulated image as a single image by forming the single image capture system 404 to correspond to the plurality of physical capture devices 402 and to provide the simulated image.

Figure 7:
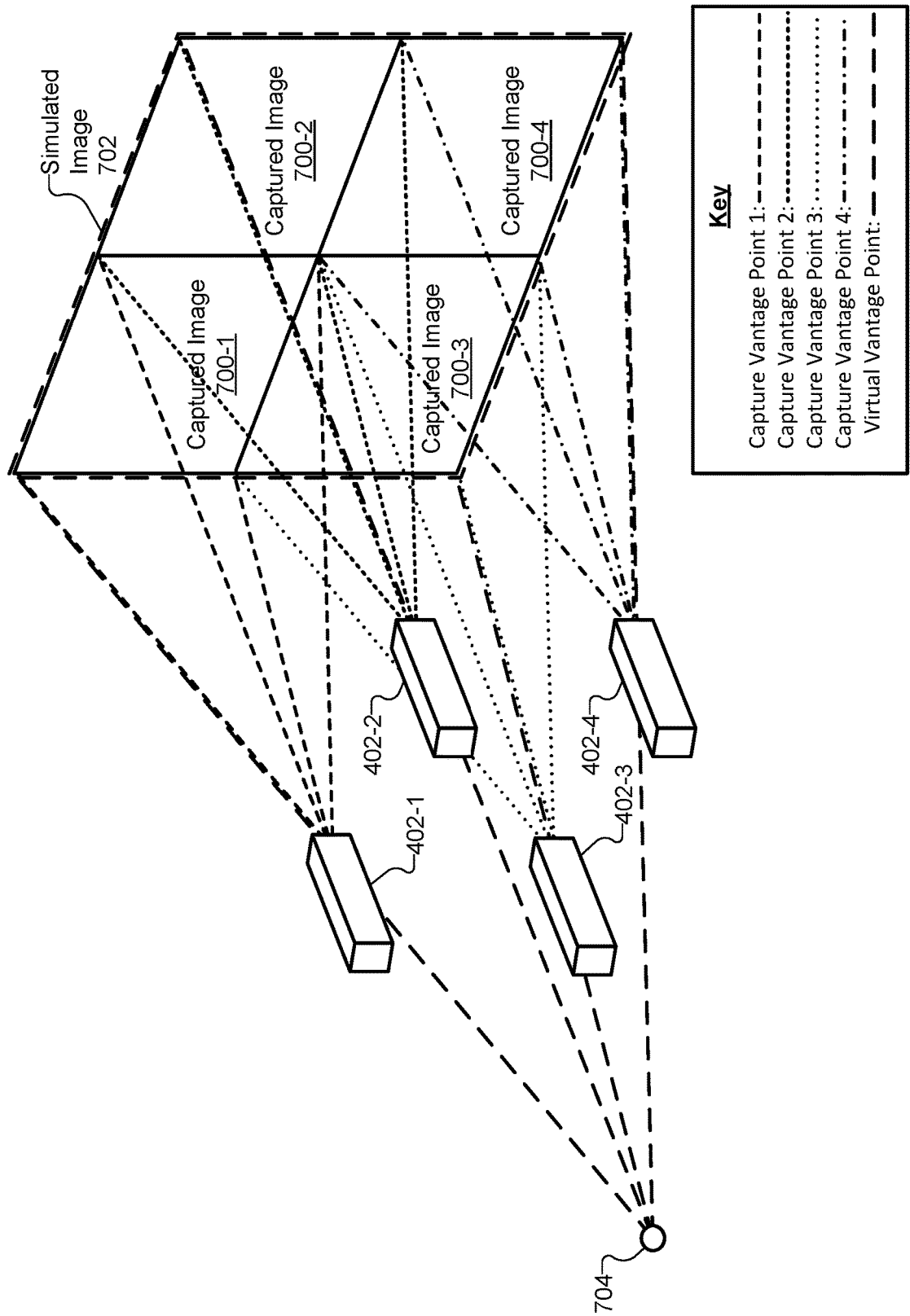
FIG. 7 illustrates an exemplary plurality of images captured from respective capture vantage points and combined into an exemplary simulated image associated with a virtual vantage point according to embodiments described herein.

To illustrate how this may be performed, FIG. 7 shows an exemplary plurality of images captured from a plurality of respective capture vantage points and combined into an exemplary simulated image associated with a virtual vantage point according to principles described herein. Specifically, as depicted in FIG. 7, the plurality of physical capture devices 402 of configuration 400-B is shown to capture four captured images 700 (i.e., captured images 700-1 through 700-4) from respective capture vantage points illustrated by respective dashed lines of the styles indicated by the Key of FIG. 7. For example, physical capture device 402-1 may be associated with "Capture Vantage Point 1" in the Key, physical capture device 402-2 may be associated with "Capture Vantage Point 2" in the Key, and so forth. Moreover, FIG. 7 shows that system 100 may combine captured images 700 into a single simulated image 702 that is associated with a virtual capture device 704 that is associated with its own respective virtual vantage point illustrated by dashed lines of a different style also indicated by the Key ("Virtual Vantage Point"). As shown, the capture vantage points from which physical capture devices 402 capture captured images 700 are associated with spatial locations that are closer to the imagery depicted in captured images 700 than the spatial location of the virtual vantage point of virtual capture device 704.

The combining of captured images 700 into simulated image 702 may be performed in any suitable way to form simulated image 702 with any suitable resolution (e.g., a resolution that is more conveniently processable by downstream systems such as data processing system 406). For instance, as shown in FIG. 7, the combining of captured images 700 into the single simulated image 702 may include stitching the plurality of captured images 700 along horizontal and vertical grid lines that form an equal number of rows and columns (e.g., the four captured images 700 in this example that forms two rows and two columns). If each of physical capture device 402 capture captured images 700 of the same resolution and aspect ratio (as shown in FIG. 7), each row may thus have a substantially equal height and each column a substantially equal width.

Figure 8:
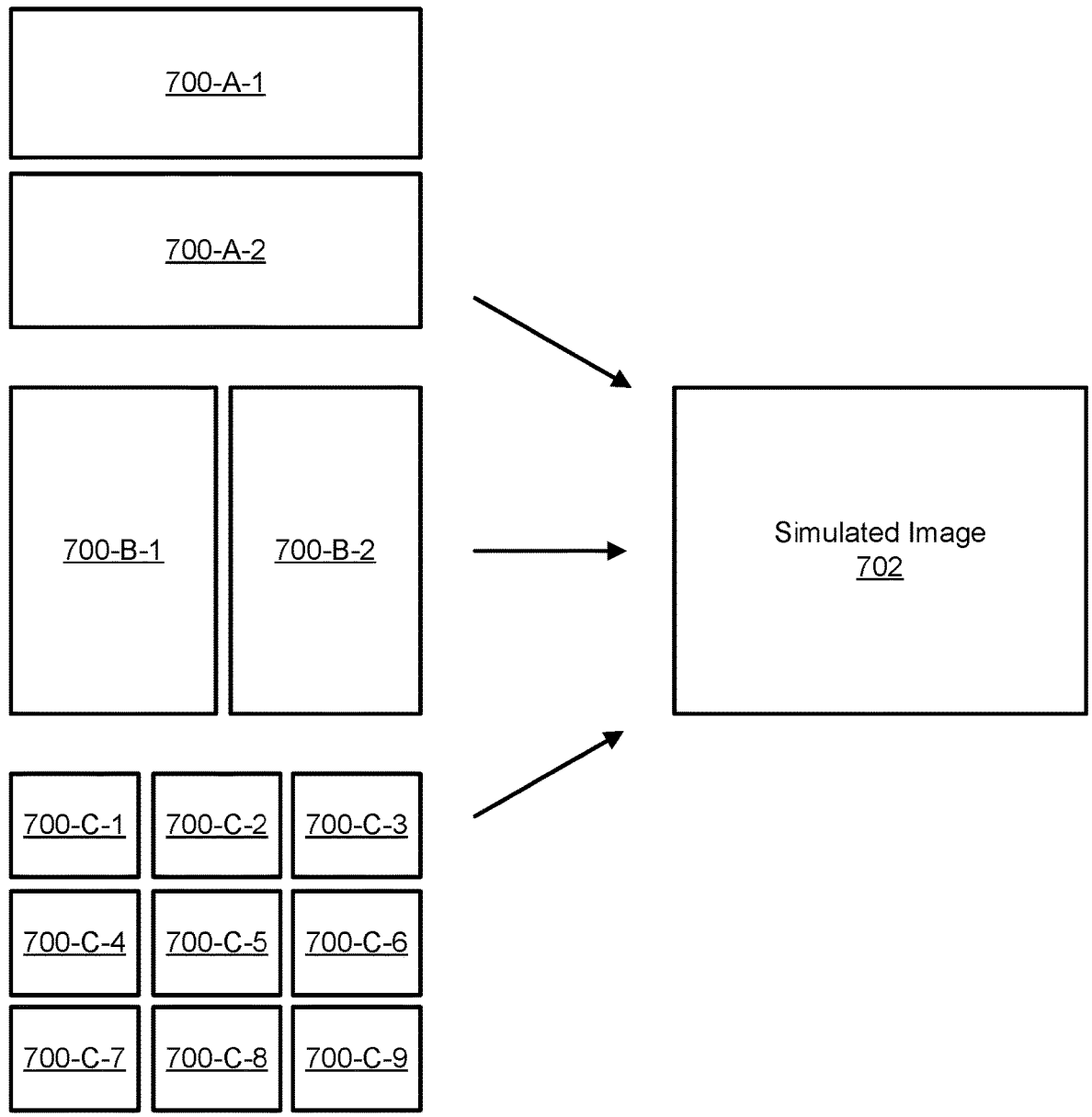
FIG. 8 illustrates various exemplary ways that sets of captured images may be combined into a simulated image according to embodiments described herein.

In certain examples, combining may also be done in a variety of ways different than shown in FIG. 7. For instance, FIG. 8 shows various exemplary ways that sets of captured images 700 may be combined into simulated image 702. In some of these examples, the number of rows and columns into which captured images 700 are arranged may be unequal and/or the respective heights and widths of the rows and columns may be unequal (e.g., if captured images 700 happen to have different resolutions and/or aspect ratios than one another). For example, captured images 700 labeled as captured images 700-A (i.e., captured images 700-A-1 and 700-A-2) are shown to be combined by stitching the images together as two rows in a single column. As another example, captured images 700 labeled as captured images 700-B (i.e., captured images 700-B-1 and 700-B-2) are shown to be combined by stitching the images together as two columns in a single row.

In other examples, as mentioned above with the simulated image 702 into which the four captured images 700 are combined in FIG. 7, the number of rows and columns may be the same, so as to from the simulated image from a perfect square (e.g., 4, 9, 16, 25, etc.) number of captured images. Captured images 700 labeled as captured images 700-C (i.e., captured images 700-C-1 through 700-C-9) provide another example of this type of scenario, in this case stitching nine captured images 500 in three columns and three rows to form the single simulated image 702.

As mentioned above, while many examples described herein relate to captured images 700 that are captured by individual capture devices (e.g., physical capture devices 402), it will also be understood that system 100 may simulate image capture in the ways illustrated in FIGS. 7 and 8 starting with images that have been generated in a manner other than being captured by individual physical capture devices. For example, the starting images accessed by system 100 (i.e., the images represented by captured images 700 in FIGS. 7 and 8) may have been generated by a previous partitioning of a larger captured image, by a previous combining of multiple captured images, virtually generated (i.e., rather than physically captured), or created in any other way as may serve a particular implementation.

Returning to FIG. 7, after system 100 has combined the plurality of captured images 700 into simulated image 702, system 100 may determine the respective virtual resolution of simulated image 702 and the respective virtual vantage point for simulated image 702 (e.g., including the spatial location of the virtual capture device 704 that could have captured simulated image 702).

To this end, system 100 may determine the virtual vantage point of virtual capture device 704 in any manner as may serve a particular implementation. For instance, in certain examples, each of the plurality of physical capture devices 402 may be associated with a respective set of capture parameters (e.g., intrinsic parameters, extrinsic parameters, etc.) that define which imagery is depicted in the respective captured images 700. In such examples, the determining of the virtual vantage point for simulated image 702 may include 1) converting the respective sets of capture parameters to an additional set of capture parameters distinct from each of the respective sets of capture parameters (e.g., an additional set of capture parameters that corresponds to virtual capture device 704 that is capable of capturing imagery depicted in simulated image 702), and 2) defining the virtual vantage point for the simulated image 702 based on the additional set of capture parameters.

Any type of capture parameters may be used in any suitable manner to define the virtual vantage point of virtual capture device 704. For example, if a set of intrinsic parameters is known for each of physical capture devices 402, one or more projection matrices may be used to convert these intrinsic parameters to intrinsic parameters of virtual capture device 704 that would capture simulated image 702. Similarly, if a respective set of extrinsic parameters is known for the capture vantage points of each physical capture device 402 (e.g., with respect to a world coordinate system), one or more projection matrices may be used to convert these extrinsic parameters to extrinsic parameters for the virtual vantage point of virtual capture device 704 at the location shown in FIG. 7. Ultimately, then, system 100 may determine (and generate metadata representative of) simulated capture parameters that include virtual intrinsic parameters for virtual capture device 704 that would capture simulated image 702, as well as virtual extrinsic parameters for where virtual capture device 704 would be placed in world space (i.e., in relation to the world coordinate system) to capture simulated image 702.

Once system 100 determines the virtual resolution and virtual vantage point for simulated image 702, system 100 may represent simulated image 702 as a single image captured at the virtual resolution and from the virtual vantage point that have been determined. For example, system 100 may represent simulated image 702 as an image that has been captured at a resolution with twice as many rows of pixels and twice as many columns of pixels as the resolution of captured images 700, and that has been captured from the virtual vantage point of virtual capture device 704. This may be done by generating metadata that is to be provided together with (e.g., transmitted together with, stored together with, or otherwise associated with) data representative of simulated image 702 and that defines the virtual vantage point of virtual capture device 704 with respect to a world coordinate system common to the simulated image 702 and to a plurality of additional images depicting imagery from other simulated or capture vantage points.

Returning to FIG. 4, the image capture systems 404 in both configurations 400 are shown to provide data to data processing system 406. Data processing system 406 may be implemented by any system of computing devices configured to receive image data from image capture systems 404 and to generate content based on the image data. For example, one such data processing system 406 may be referred to herein as a volumetric processing system (e.g., a modular volumetric processing system). System 100 may be communicatively coupled to such a volumetric processing system, and the volumetric processing system may include, as will be described and illustrated in more detail below, a set of point cloud generators (i.e., computing systems configured to perform operations associated with point cloud generation), a point cloud organizer (i.e., a computing system configured to perform operations associated with point cloud organization), a voxelizer (i.e., a computing system configured to perform voxelization operations), and a set of patch renderers associated with the voxelizer (i.e., computing systems configured to perform patch rendering operations).

In the example of configuration 400-A, the representing of each simulated image 502 as a distinct image captured at the respective virtual resolution and from the respective virtual vantage point may include providing, to a different point cloud generator of the set of point cloud generators in data processing system 406, each simulated image 502 at the respective virtual resolution. Moreover, the simulated images 502 may each be provided together with metadata indicating, as the vantage point from which each simulated image is captured, the respective virtual vantage point that has been determined. Accordingly, as will be described in more detail below, the set of point cloud generators may generate respective point clouds for each of the virtual vantage points based on the provided plurality of simulated images 502. The point cloud organizer may consolidate point cloud data from one or more of the respective point clouds generated by the set of point cloud generators (e.g., where the point cloud data corresponds to a surface of an object depicted in the image). The voxelizer may generate a voxel grid representative of the object based on the consolidated point cloud data for the object. Then, based on the voxel grid, the set of patch renderers may generate a set of rendered patches each depicting at least a part of the surface of the object.

Similarly, in the example of configuration 400-B, the representing of simulated image 702 as a single image captured at the virtual resolution and from the virtual vantage point may include providing, to a point cloud generator of the set of point cloud generators in data processing system 406, simulated image 702 at the virtual resolution. Moreover, simulated image 702 may be provided together with metadata indicating, as the vantage point from which simulated image 702 is captured, the virtual vantage point that has been determined. Accordingly, as will be described in more detail below, the set of point cloud generators may generate a plurality of point clouds including a point cloud for the virtual vantage point based on the provided simulated image 702. The point cloud organizer may consolidate point cloud data from one or more of the plurality of point clouds generated by the set of point cloud generators (e.g., where the point cloud data corresponds to a surface of an object depicted in the image). The voxelizer may generate a voxel grid representative of the object based on the consolidated point cloud data for the object. Then, based on the voxel grid, the set of patch renderers may generate a set of rendered patches each depicting at least a part of the surface of the object.

Figure 9:
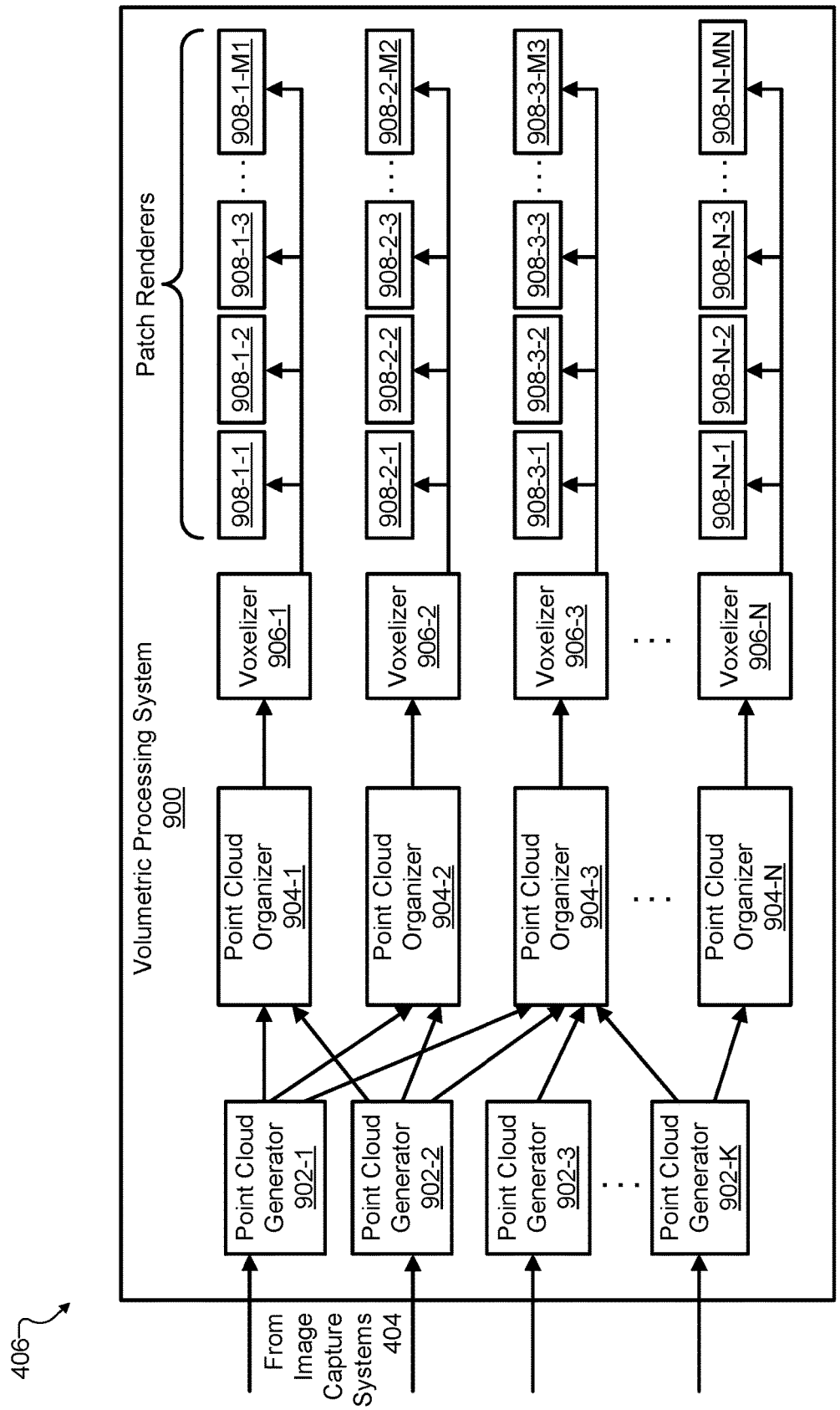
FIG. 9 illustrates an exemplary volumetric processing system according to embodiments described herein.

To illustrate in more detail, FIG. 9 shows an exemplary volumetric processing system 900 that may be employed in certain examples to implement data processing system 406 of FIG. 4. Additional details related to volumetric processing systems such as volumetric processing system 900 are described in co-pending U.S. patent application Ser. No. 16/587,285 ("the co-pending application"), which is filed the same day as the present application and is entitled SYSTEMS AND METHODS FOR PROCESSING VOLUMETRIC DATA USING A MODULAR NETWORK ARCHITECTURE. The content of this co-pending application is hereby incorporated by reference in its entirety.

As described in more detail in the co-pending application, volumetric processing system 900 is configured to process volumetric data using a modular network architecture that is highly scalable so as to incorporate a plurality of each type of component mentioned above (e.g., point cloud generators, point cloud organizers, voxelizers, patch renderers, etc.) so as to be capable of processing volumetric data for a capture area that includes a plurality of different objects (e.g., N different objects, where N is any integer representative of the number of objects included within the capture area). Specifically, as shown in FIG. 9, volumetric processing system 900 includes a set of point cloud generators 902 that may each correspond to a respective image capture system 404 as have been described herein (not explicitly shown in FIG. 9). As has been described, image capture systems 404 may be associated with any number of physical capture devices (e.g., one physical capture device in a standard one-to-one configuration, a portion of one physical capture device in a configuration such as configuration 400-A, a plurality of physical capture devices in a configuration such as configuration 400-B, etc.) disposed at different vantage points and configured to capture and provide surface data representative of color and depth characteristics of surface points of various objects (e.g., N objects) located within a capture area. The set of point cloud generators 902 may include K point cloud generators 902 (where K is the number of image capture systems 404 employed in a particular implementation) and may be configured to generate respective point clouds for each of the K different vantage points based on the surface data captured and provided by image capture systems 404.

Volumetric processing system 900 further includes a plurality of point cloud organizers 904 (e.g., N point cloud organizers 904-1 through 904-N) that are configured to consolidate respective point cloud data (e.g., first point cloud data, second point cloud data, etc., up to Nth point cloud data) that corresponds to respective surfaces of the N objects included in the capture area. For example, as will be described in more detail below, point cloud organizer 904-1 consolidates first point cloud data corresponding to a surface of a first object from a subset of point clouds (i.e., point clouds generated by point cloud generators 902-1 and 902-2), point cloud organizer 904-2 consolidates second point cloud data corresponding to a surface of a second object from the same subset of point clouds, point cloud organizer 904-3 consolidates third point cloud data corresponding to a surface of a third object from a different subset of point clouds (i.e., point clouds generated by point cloud generators 902-1, 902-2, 902-3, and 902-K), and so forth.

Volumetric processing system 900 further includes a plurality of voxelizers 906 (e.g., N voxelizers 906-1 through 906-N) that are configured to generate respective voxel grids representative of the respective objects with which the voxelizers are associated. More particularly, each voxelizer 906 corresponds with and receives consolidated point cloud data from a particular point cloud organizer 904, and the point cloud data is representative of all the relevant point cloud data that has been consolidated (e.g., from the relevant subset of point cloud generators 902) for the respective object. For example, voxelizer 906-1 generates a first voxel grid representative of the first object based on the consolidated first point cloud data, voxelizer 906-2 generates a second voxel grid representative of the second object based on the consolidated second point cloud data, voxelizer 906-3 generates a third voxel grid representative of the third object based on the consolidated third point cloud data, and so forth.

Associated with each point cloud organizer 904 and voxelizer 906 pair, volumetric processing system 900 further includes a respective set of patch renderers 908 (e.g., N sets of patch renderers 908 labeled patch renderers 908-1-X through 908-N-X, where X represents an index between 1 and a particular value of M (i.e., M1 through MN) for differentiating the different patch renderers in each respective set of patch renderers). Each set of patch renderers 908 may be configured to generate, based on a respective voxel grid generated by the associated voxelizer 906, a respective set of rendered patches each depicting at least a part of the surface of the respective object. For example, the set of patch renderers 908-1 associated with voxelizer 906-1 may generate M1 rendered patches each depicting at least a part of the surface of the first object based on the first voxel grid, the set of patch renderers 908-2 associated with voxelizer 906-2 may generate M2 rendered patches each depicting at least a part of the surface of the second object based on the second voxel grid, the set of patch renderers 908-3 associated with voxelizer 906-3 may generate M3 rendered patches each depicting at least a part of the surface of the third object based on the third voxel grid, and so forth.

Additional description and detail relating to how each of the system components of volumetric processing system 900 operates to process volumetric data using a modular network architecture is provided in the co-pending application that is incorporated by reference in its entirety.

Returning to FIG. 4, data processing system 406 (e.g., implemented by volumetric processing system 900 or another suitable data processing system) may provide data to media player device 408. For example, the provided data may include the rendered patches generated by patch renderers 908 described above.

Media player device 408 may be implemented as (or may be included within) any suitable computing system or device as may be employed for performing any of the use cases or applications described herein. Specifically, for example, media player device 408 may include one or more display screens (e.g., traditional display screens, partially transparent heads-up display ("HUD") screens, computer monitors, etc.) configured to display rendered graphics representative of an extended reality world presented by media player device 408. Media player device 408 may be implemented as a mobile device (e.g., a smartphone, a tablet computing device, etc.), a virtual or augmented reality device (e.g., a head-mounted device configured to display graphics directly in front of each eye of user 410), a portable or stationary computing device (e.g., a personal desktop or laptop computer, etc.), a television device, or any other system or device as may serve a particular implementation.

User 410 may represent any person viewing graphics presented by media player device 408 and will be understood to have some degree of control over what graphics media player device 408 presents. For example, user 410 may indicate a particular viewpoint, within an extended reality world corresponding to a capture area captured by physical capture devices 402, from which user 410 wishes to view the world by moving an avatar around within the extended reality world, turning to look in different directions, and so forth. As user 410 navigates in this manner, media player device 408 may be configured to render the extended reality world from the desired viewpoint based on the extended reality media content (e.g., the rendered patches and so forth) provided by data processing system 406.

While configurations 400 each show direct communication between data processing system 406 and media player device 408, it will be understood that additional data processing and transmission may occur within an architecture that provides media content to media player devices such as media player device 408. For example, while data processing system 406 may generate respective sets of rendered patches depicting various objects included in a extended reality world, data processing system may include or be communicatively coupled to additional computing components configured to package, encode, and otherwise prepare such rendered images for transmission over a network to media player device 408, none of which is explicitly shown in configurations 400 of FIG. 4.

Figure 10:
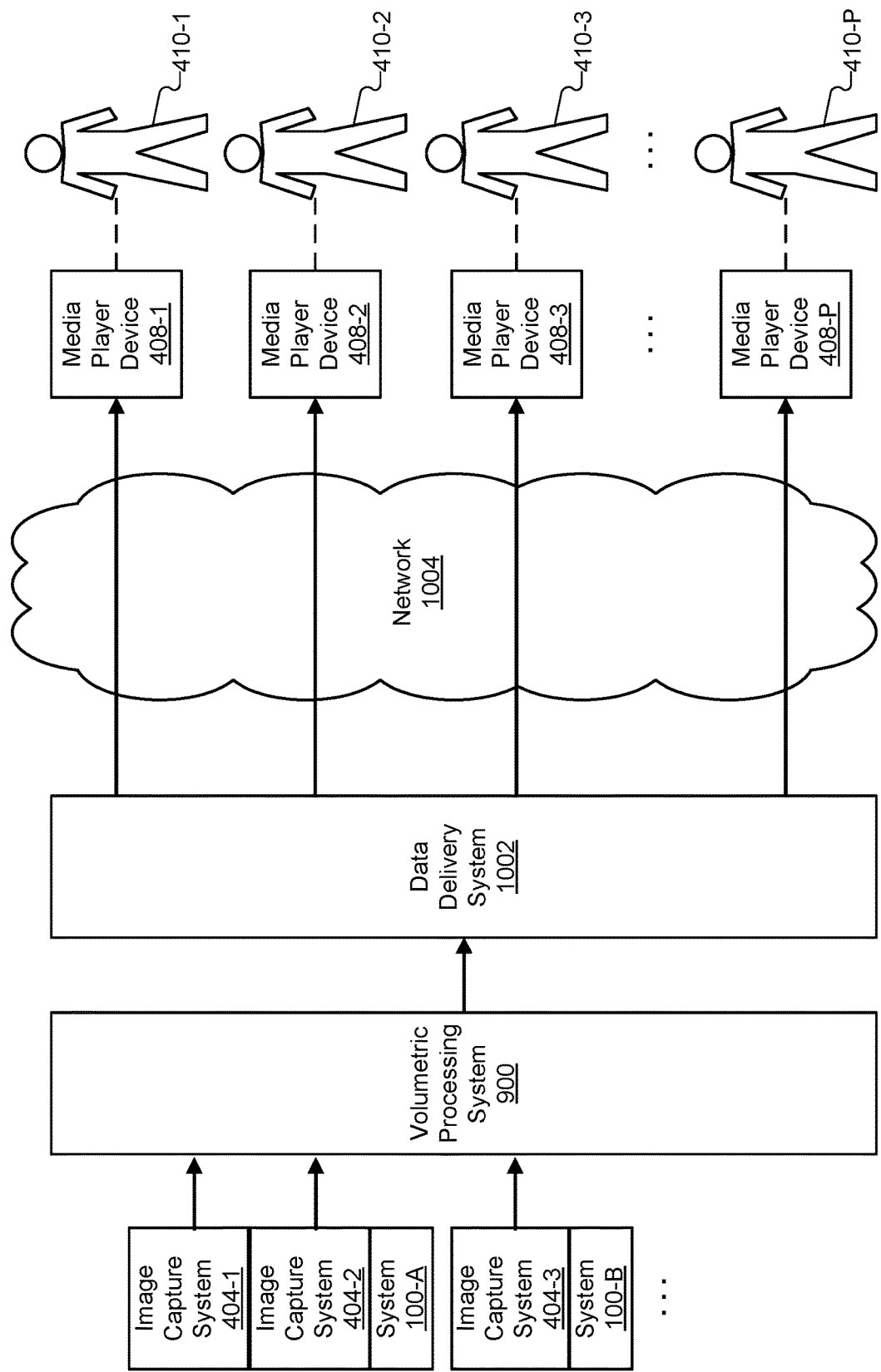
FIG. 10 illustrates an exemplary configuration in which the image simulation system of FIG. 1 and the volumetric processing system of FIG. 9 interoperate to provide extended reality media content for users to experience according to embodiments described herein.

To illustrate a configuration depicting certain such additional details, FIG. 10 shows an exemplary configuration 1000 in which respective implementations of system 100 and an implementation of volumetric processing system 900 interoperate to provide extended reality media content for a plurality of users to experience according to principles described herein. Specifically, one implementation of system 100 (i.e., image simulation system 100-A, labeled as "system 100-A") is shown to be associated with a plurality of image capture systems 404 (i.e., image capture systems 404-1 and 404-2) that provide data to volumetric processing system 900. Another implementation of system 100 (i.e., image simulation system 100-B) is shown to be associated with a single image capture system 404 (i.e., image capture system 404-3) that provides data to volumetric processing system 900. It will be understood that additional image simulation systems and corresponding image capture systems may similarly provide image data to volumetric processing system 900 as may serve a particular implementation.

Volumetric processing system provides data (e.g., rendered patches generated by the respective sets of patch renderers 908) to a data delivery system 1002 that will be understood to include any suitable computing resources configured to receive and process rendered patches (e.g., arranged together in atlas images as described in the co-pending application) to prepare and provide the rendered patches to media player devices 408 together with any other data (e.g., metadata, etc.) as may be useful to allow media player devices 408 to render the extended reality world based on the rendered patches. To this end, data delivery system 1002 may include encoding resources configured to convert sequences of atlas images to video images in standard encoded formats that may be convenient for transferring (e.g., streaming) extended reality media content to media player devices 408 (e.g., media player devices 408-1 through 408-P, where P represents the number of media player devices presenting the extended reality world to users 410), and for processing and/or rendering the data by media player devices 408.

As shown, data delivery system 1002 may transmit data representative of extended reality media content to media player devices 408 (which are associated with respective users 410-1 through 410-P) by way of a network 1004. In some examples, network 1004 may include or be implemented by a provider-specific wired or wireless communications network (e.g., a cellular network used for mobile phone and data communications, a 4G or 5G network or network of another suitable technology generation, a cable or satellite carrier network, a mobile telephone network, etc.) that is operated and/or managed by a provider entity such as a mobile network operator (e.g., a wireless service provider, a wireless carrier, a cellular company, etc.). For instance, the provider of such a provider network may own or control all of the elements necessary to sell and deliver communications services to users 410, including radio spectrum allocation, wireless network infrastructure, back haul infrastructure, customer care, provisioning of devices, network repair for network 1004, and so forth.

Additionally or alternatively, network 1004 may include or be implemented by any interconnected network infrastructure that is external to a provider network and outside of the control of a specific network provider. For example, network 1004 may include the Internet, a wide area network, a content delivery network, and/or any other suitable network or networks. In any case, network 1004 may be configured to provide data delivery between server-side provider systems (e.g., image capture systems 404 formed by implementations of system 100, volumetric processing system 900, data delivery system 1002, etc.) and client-side systems and devices (e.g., media player devices 408). To this end, network 1004 may implement or employ any suitable communication technologies, devices, media, protocols, or the like as may serve a particular implementation.

Figure 11:
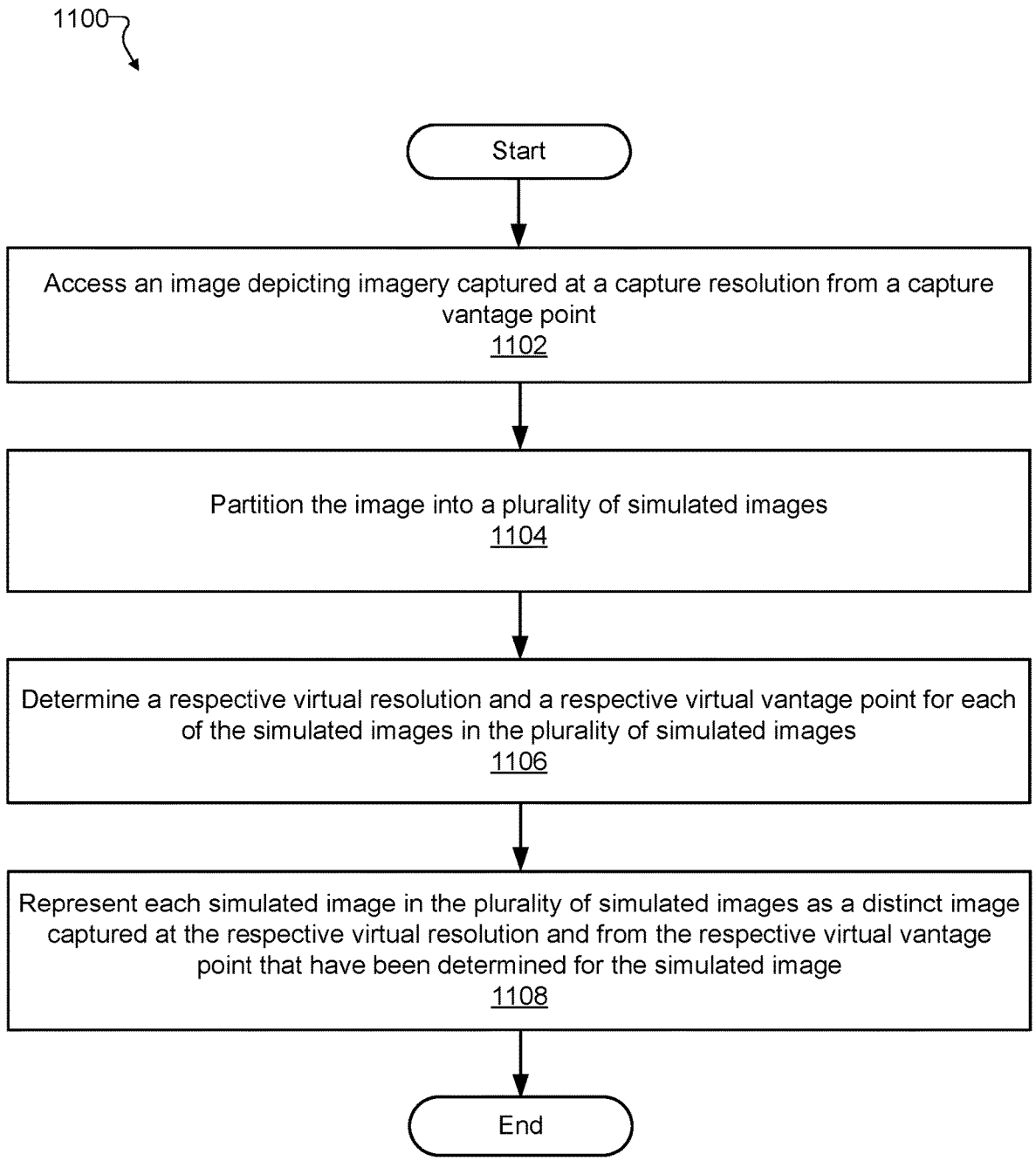
FIG. 11 illustrates an exemplary method for simulating image capture in an extended reality system according to embodiments described herein.

FIG. 11 illustrates an exemplary method 1100 for simulating image capture in an extended reality system. While FIG. 11 illustrates exemplary operations according to one embodiment, other embodiments may omit, add to, reorder, and/or modify any of the operations shown in FIG. 11. One or more of the operations shown in FIG. 11 may be performed by system 100, any components included therein, and/or any implementation thereof.

In operation 1102, an image simulation system may access an image. For example, the image may depict imagery captured at a capture resolution from a capture vantage point. Operation 1102 may be performed in any of the ways described herein.

In operation 1104, the image simulation system may partition the image accessed in operation 1102 into a plurality of simulated images. Operation 1104 may be performed in any of the ways described herein.

In operation 1106, the image simulation system may determine a respective virtual resolution and a respective virtual vantage point for each of the simulated images in the plurality of simulated images partitioned in operation 1104. In some examples, operation 1106 may be performed such that each virtual resolution is determined to be different from the capture resolution, and each virtual vantage point is determined to be different from the capture vantage point. Operation 1106 may be performed in any of the ways described herein.

In operation 1108, the image simulation system may represent each simulated image of the plurality of simulated images as a distinct image. For example, each of these distinct images may be represented in operation 1108 to have been captured at the respective virtual resolution and from the respective virtual vantage point that have been determined in operation 1106 for the simulated image. Operation 1108 may be performed in any of the ways described herein.

Figure 12:
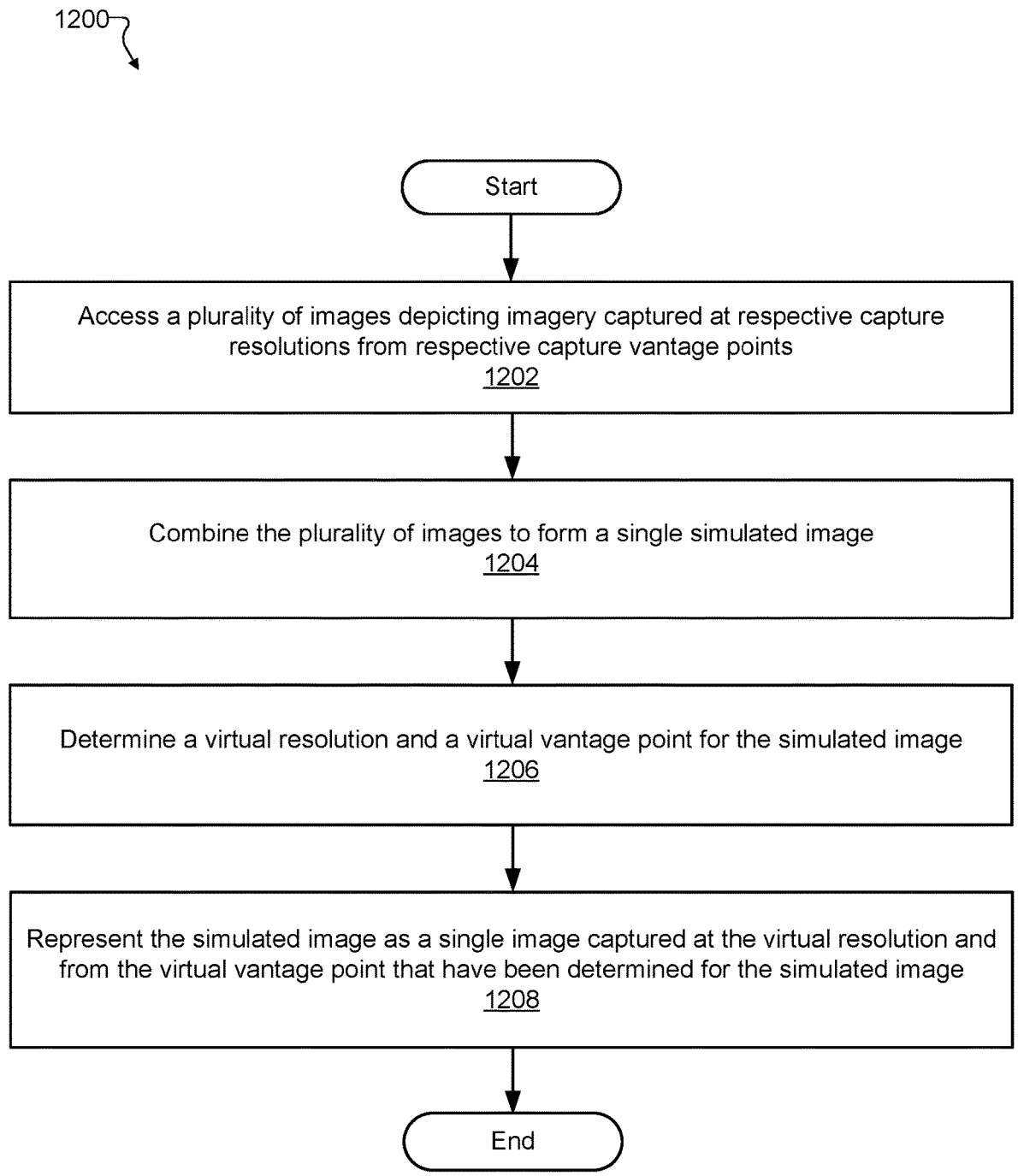
FIG. 12 illustrates another exemplary method for simulating image capture in an extended reality system at a virtual resolution from a virtual vantage point according to embodiments described herein.

FIG. 12 illustrates an exemplary method 1200 for simulating image capture in an extended reality system. As with FIG. 11 described above, while FIG. 12 illustrates exemplary operations according to one embodiment, other embodiments may omit, add to, reorder, and/or modify any of the operations shown in FIG. 12. One or more of the operations shown in FIG. 12 may be performed by system 100, any components included therein, and/or any implementation thereof.

In operation 1202, an image simulation system may access a plurality of images. For example, the plurality of images may depict imagery captured at respective capture resolutions from respective capture vantage points. Operation 1202 may be performed in any of the ways described herein.

In operation 1204, the image simulation system may combine the plurality of images accessed in operation 1202 to form a single simulated image. Operation 1204 may be performed in any of the ways described herein.

In operation 1206, the image simulation system may determine a virtual resolution and a virtual vantage point for the simulated image formed in operation 1204. In some examples, operation 1206 may be performed such that the virtual resolution is determined to be different from each of the respective capture resolutions, and the virtual vantage point is determined to be different from each of the respective capture vantage points. Operation 1206 may be performed in any of the ways described herein.

In operation 1208, the image simulation system may represent the simulated image as a single image. For example, the image may be represented in operation 1208 to have been captured at the virtual resolution and from the virtual vantage point that have been determined in operation 1206 for the simulated image. Operation 1208 may be performed in any of the ways described herein.

In certain embodiments, one or more of the systems, components, and/or processes described herein may be implemented and/or performed by one or more appropriately configured computing devices. To this end, one or more of the systems and/or components described above may include or be implemented by any computer hardware and/or computer-implemented instructions (e.g., software) embodied on at least one non-transitory computer-readable medium configured to perform one or more of the processes described herein. In particular, system components may be implemented on one physical computing device or may be implemented on more than one physical computing device. Accordingly, system components may include any number of computing devices, and may employ any of a number of computer operating systems.

In certain embodiments, one or more of the processes described herein may be implemented at least in part as instructions embodied in a non-transitory computer-readable medium and executable by one or more computing devices. In general, a processor (e.g., a microprocessor) receives instructions, from a non-transitory computer-readable medium, (e.g., a memory, etc.), and executes those instructions, thereby performing one or more processes, including one or more of the processes described herein. Such instructions may be stored and/or transmitted using any of a variety of known computer-readable media.

A computer-readable medium (also referred to as a processor-readable medium) includes any non-transitory medium that participates in providing data (e.g., instructions) that may be read by a computer (e.g., by a processor of a computer). Such a medium may take many forms, including, but not limited to, non-volatile media, and/or volatile media. Non-volatile media may include, for example, optical or magnetic disks and other persistent memory. Volatile media may include, for example, dynamic random access memory ("DRAM"), which typically constitutes a main memory. Common forms of computer-readable media include, for example, a disk, hard disk, magnetic tape, any other magnetic medium, a compact disc read-only memory ("CD-ROM"), a digital video disc ("DVD"), any other optical medium, random access memory ("RAM"), programmable read-only memory ("PROM"), electrically erasable programmable read-only memory ("EPROM"), FLASH-EEPROM, any other memory chip or cartridge, or any other tangible medium from which a computer can read.

Figure 13:
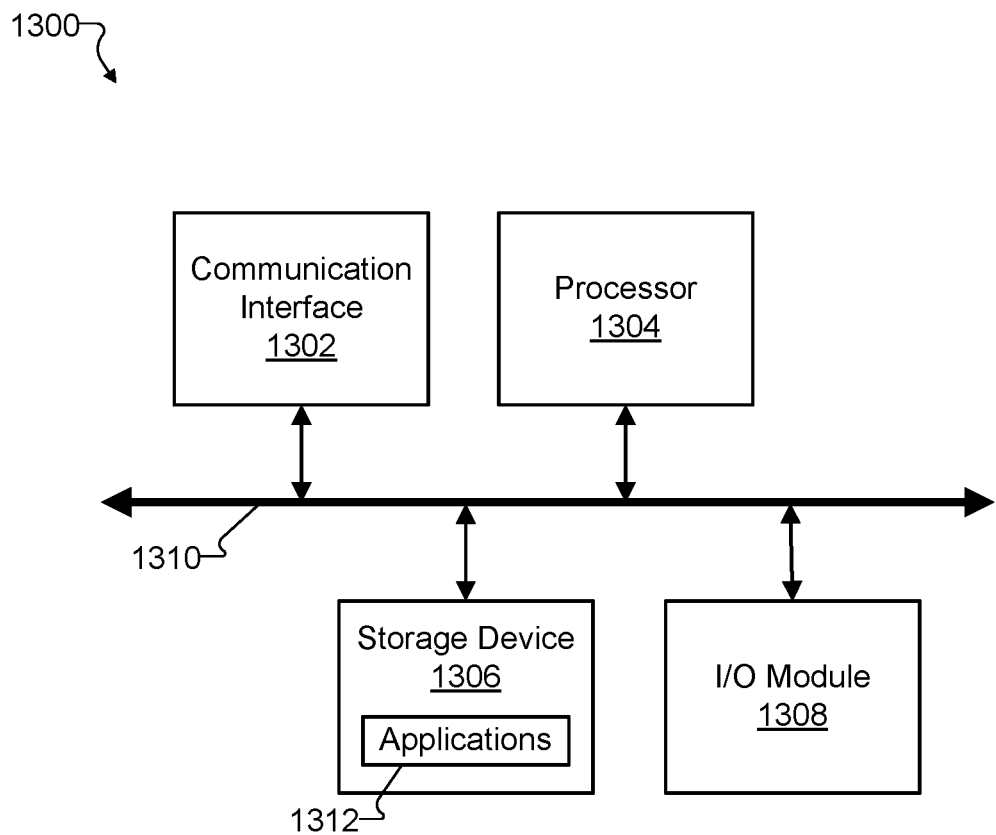
FIG. 13 illustrates an exemplary computing device according to embodiments described herein.

FIG. 13 illustrates an exemplary computing device 1300 that may be specifically configured to perform one or more of the processes described herein. For example, computing device 1300 may implement an image simulation system such as system 100, an implementation thereof, or any other system or device described herein (e.g., image capture system 402, data processing system 406 or an implementation or component thereof such as volumetric processing system 900, media player device 408, data delivery system 1002, etc.).

As shown in FIG. 13, computing device 1300 may include a communication interface 1302, a processor 1304, a storage device 1306, and an input/output ("I/O") module 1308 communicatively connected via a communication infrastructure 1310. While an exemplary computing device 1300 is shown in FIG. 13, the components illustrated in FIG. 13 are not intended to be limiting. Additional or alternative components may be used in other embodiments. Components of computing device 1300 shown in FIG. 13 will now be described in additional detail.

Communication interface 1302 may be configured to communicate with one or more computing devices. Examples of communication interface 1302 include, without limitation, a wired network interface (such as a network interface card), a wireless network interface (such as a wireless network interface card), a modem, an audio/video connection, and any other suitable interface.

Processor 1304 generally represents any type or form of processing unit capable of processing data or interpreting, executing, and/or directing execution of one or more of the instructions, processes, and/or operations described herein. Processor 1304 may direct execution of operations in accordance with one or more applications 1312 or other computer-executable instructions such as may be stored in storage device 1306 or another computer-readable medium.

Storage device 1306 may include one or more data storage media, devices, or configurations and may employ any type, form, and combination of data storage media and/or device. For example, storage device 1306 may include, but is not limited to, a hard drive, network drive, flash drive, magnetic disc, optical disc, RAM, dynamic RAM, other non-volatile and/or volatile data storage units, or a combination or sub-combination thereof. Electronic data, including data described herein, may be temporarily and/or permanently stored in storage device 1306. For example, data representative of one or more executable applications 1312 configured to direct processor 1304 to perform any of the operations described herein may be stored within storage device 1306. In some examples, data may be arranged in one or more databases residing within storage device 1306.

I/O module 1308 may include one or more I/O modules configured to receive user input and provide user output. One or more I/O modules may be used to receive input for a single virtual experience. I/O module 1308 may include any hardware, firmware, software, or combination thereof supportive of input and output capabilities. For example, I/O module 1308 may include hardware and/or software for capturing user input, including, but not limited to, a keyboard or keypad, a touchscreen component (e.g., touchscreen display), a receiver (e.g., an RF or infrared receiver), motion sensors, and/or one or more input buttons.

I/O module 1308 may include one or more devices for presenting output to a user, including, but not limited to, a graphics engine, a display (e.g., a display screen), one or more output drivers (e.g., display drivers), one or more audio speakers, and one or more audio drivers. In certain embodiments, I/O module 1308 is configured to provide graphical data to a display for presentation to a user. The graphical data may be representative of one or more graphical user interfaces and/or any other graphical content as may serve a particular implementation.

In some examples, any of the facilities described herein may be implemented by or within one or more components of computing device 1300. For example, one or more applications 1312 residing within storage device 1306 may be configured to direct processor 1304 to perform one or more processes or functions associated with processing facility 104 of system 100. Likewise, storage facility 102 of system 100 may be implemented by or within storage device 1306.

To the extent the aforementioned embodiments collect, store, and/or employ personal information provided by individuals, it should be understood that such information shall be used in accordance with all applicable laws concerning protection of personal information. Additionally, the collection, storage, and use of such information may be subject to consent of the individual to such activity, for example, through well known "opt-in" or "opt-out" processes as may be appropriate for the situation and type of information. Storage and use of personal information may be in an appropriately secure manner reflective of the type of information, for example, through various encryption and anonymization techniques for particularly sensitive information.

In the preceding description, various exemplary embodiments have been described with reference to the accompanying drawings. It will, however, be evident that various modifications and changes may be made thereto, and additional embodiments may be implemented, without departing from the scope of the invention as set forth in the claims that follow. For example, certain features of one embodiment described herein may be combined with or substituted for features of another embodiment described herein. The description and drawings are accordingly to be regarded in an illustrative rather than a restrictive sense.

What is claimed is:

1. A method comprising:
   accessing, by an image simulation system, an image depicting imagery captured at a capture resolution from a capture vantage point;
   partitioning, by the image simulation system, the image into a plurality of simulated images by dividing the image along at least one horizontal gridline and at least one vertical gridline so as to divide the image into a plurality of rows and a plurality of columns;
   determining, by the image simulation system, a respective virtual resolution and a respective virtual vantage point for each of the simulated images in the plurality of simulated images, each virtual resolution different from the capture resolution and each virtual vantage point different from the capture vantage point;
   generating, by the image simulation system, metadata representative of the respective virtual resolution and virtual vantage point for each of the simulated images in the plurality of simulated images; and
   providing, by the image simulation system for use as extended reality media content, the plurality of simulated images together with the metadata, the providing including representing each simulated image as a distinct image captured at the respective virtual resolution and from the respective virtual vantage point that have been determined for the simulated image.

2. The method of claim 1, wherein:
   the image simulation system is communicatively coupled to a volumetric processing system that includes a set of point cloud generators, a point cloud organizer, a voxelizer, and a set of patch renderers associated with the voxelizer;

the providing includes providing each simulated image of the plurality of simulated images to a different point cloud generator of the set of point cloud generators; and the method further comprises:
- generating, by the set of point cloud generators, respective point clouds for each of the virtual vantage points based on the provided plurality of simulated images,
- consolidating, by the point cloud organizer, point cloud data from one or more of the respective point clouds generated by the set of point cloud generators, the point cloud data corresponding to a surface of an object depicted in the image,
- generating, by the voxelizer based on the consolidated point cloud data for the object, a voxel grid representative of the object, and
- generating, based on the voxel grid by the set of patch renderers, a set of rendered patches each depicting at least a part of the surface of the object.

3. The method of claim 1, wherein:

the accessing of the image includes capturing, by a single physical capture device disposed at the capture vantage point, the image at the capture resolution; and the representing of each simulated image as a distinct image includes forming a plurality of image capture systems corresponding to the single physical capture device and each providing a different simulated image of the plurality of simulated images.

4. The method of claim 3, wherein:

the single physical capture device is associated with a set of capture parameters defining which imagery is depicted in the image; and the determining of the respective virtual vantage point for a particular simulated image of the plurality of simulated images includes:
- converting the set of capture parameters to an additional set of capture parameters distinct from the set of capture parameters, the additional set of capture parameters corresponding to a virtual capture device capable of capturing imagery depicted in the particular simulated image, and
- defining the respective virtual vantage point for the particular simulated image based on the additional set of capture parameters.

5. The method of claim 1, wherein the metadata defines each of the respective virtual vantage points with respect to a world coordinate system common to each of the simulated images in the plurality of simulated images.

6. The method of claim 1, wherein:

the plurality of rows is equal to the plurality of columns;

each row of the plurality of rows has a substantially equal height; and each column of the plurality of columns has a substantially equal width.

7. The method of claim 1, embodied as computer-executable instructions on at least one non-transitory computer-readable medium.

8. A method comprising:

accessing, by an image simulation system, a plurality of images depicting imagery captured at respective capture resolutions from respective capture vantage points;

combining, by the image simulation system, the plurality of images to form a single simulated image by stitching the plurality of images along at least one horizontal gridline and at least one vertical gridline when the plurality of images are arranged in a plurality of rows and a plurality of columns;

determining, by the image simulation system, a virtual resolution and a virtual vantage point for the simulated image, the virtual resolution different from each of the respective capture resolutions and the virtual vantage point different from each of the respective capture vantage points;

generating, by the image simulation system, metadata representative of the virtual resolution and the virtual vantage point for the simulated image; and providing, by the image simulation system for use as extended reality media content, the simulated image together with the metadata, the providing including representing the simulated image as a single image captured at the virtual resolution and from the virtual vantage point that have been determined for the simulated image.

9. The method of claim 8, wherein:

the image simulation system is communicatively coupled to a volumetric processing system that includes a set of point cloud generators, a point cloud organizer, a voxelizer, and a set of patch renderers associated with the voxelizer;

the providing includes providing the simulated image to a point cloud generator of the set of point cloud generators; and the method further comprises:
- generating, by the set of point cloud generators, a plurality of point clouds including a point cloud for the virtual vantage point based on the provided simulated image,
- consolidating, by the point cloud organizer, point cloud data from one or more of the plurality of point clouds generated by the set of point cloud generators, the point cloud data corresponding to a surface of an object depicted in the image,
- generating, by the voxelizer based on the consolidated point cloud data for the object, a voxel grid representative of the object, and
- generating, based on the voxel grid by the set of patch renderers, a set of rendered patches each depicting at least a part of the surface of the object.

10. The method of claim 8, wherein:

the accessing of the plurality of images includes capturing, by a plurality of physical capture devices disposed at the respective capture vantage points, the plurality of images at the respective capture resolutions; and the representing of the simulated image as a single image includes forming a single image capture system corresponding to the plurality of physical capture devices, the single image capture system providing the simulated image.

11. The method of claim 10, wherein:

each of the plurality of physical capture devices is associated with a respective set of capture parameters defining which imagery is depicted in the respective images captured by the physical capture devices; and the determining of the virtual vantage point for the simulated image includes:
- converting the respective sets of capture parameters to an additional set of capture parameters distinct from each of the respective sets of capture parameters, the additional set of capture parameters corresponding to a virtual capture device capable of capturing imagery depicted in the single simulated image, and defining the virtual vantage point for the simulated image based on the additional set of capture parameters.

12. The method of claim 8, wherein the metadata defines the virtual vantage point with respect to a world coordinate system common to the simulated image and to a plurality of additional images depicting the imagery from other simulated or capture vantage points.

13. The method of claim 8, wherein:
the plurality of rows is equal to the plurality of columns;
each row of the plurality of rows has a substantially equal height; and
each column of the plurality of columns has a substantially equal width.

14. The method of claim 8, embodied as computer-executable instructions on at least one non-transitory computer-readable medium.

15. A system comprising:
a memory storing instructions; and
a processor communicatively coupled to the memory and configured to execute the instructions to:
   access an image depicting imagery captured at a capture resolution from a capture vantage point,
   partition the image into a plurality of simulated images by dividing the image along at least one horizontal gridline and at least one vertical gridline so as to divide the image into a plurality of rows and a plurality of columns,
   determine a respective virtual resolution and a respective virtual vantage point for each of the simulated images in the plurality of simulated images, each virtual resolution different from the capture resolution and each virtual vantage point different from the capture vantage point,
   generate metadata representative of the respective virtual resolution and virtual vantage point for each of the simulated images in the plurality of simulated images, and
   provide, for use as extended reality media content, the plurality of simulated images together with the metadata, the providing including representing each simulated image as a distinct image captured at the respective virtual resolution and from the respective virtual vantage point that have been determined for the simulated image.

16. The system of claim 15, further comprising a set of point cloud generators, a point cloud organizer, a voxelizer, and a set of patch renderers associated with the voxelizer; and
wherein:
   the providing includes providing each simulated image of the plurality of simulated images to a different point cloud generator of the set of point cloud generators,
   the set of point cloud generators is configured to generate respective point clouds for each of the virtual vantage points based on the provided plurality of simulated images,
   the point cloud organizer is configured to consolidate point cloud data from one or more of the respective point clouds generated by the set of point cloud generators, the point cloud data corresponding to a surface of an object depicted in the image,
   the voxelizer is configured to generate, based on the consolidated point cloud data for the object, a voxel grid representative of the object, and
   the set of patch renderers is configured to generate a set of rendered patches each depicting at least a part of the surface of the object.

17. The system of claim 15, wherein:
the accessing of the image includes capturing, by a single physical capture device disposed at the capture vantage point, the image at the capture resolution; and
the representing of each simulated image as a distinct image includes forming a plurality of image capture systems corresponding to the single physical capture device and each providing a different simulated image of the plurality of simulated images.

18. A system comprising:
a memory storing instructions; and
a processor communicatively coupled to the memory and configured to execute the instructions to:
   access a plurality of images depicting imagery captured at respective capture resolutions from respective capture vantage points,
   combine the plurality of images to form a single simulated image by stitching the plurality of images along at least one horizontal grid line and at least one vertical gridline when the plurality of images are arranged in a plurality of rows and a plurality of columns,
   determine a virtual resolution and a virtual vantage point for the simulated image, the virtual resolution different from each of the respective capture resolutions and the virtual vantage point different from each of the respective capture vantage points,
   generate metadata representative of the virtual resolution and the virtual vantage point for the simulated image, and
   provide, for use as extended reality media content, the simulated image together with the metadata, the providing including representing the simulated image as a single image captured at the virtual resolution and from the virtual vantage point that have been determined for the simulated image.

19. The system of claim 18, further comprising a set of point cloud generators, a point cloud organizer, a voxelizer, and a set of patch renderers associated with the voxelizer; and
wherein:
   the providing includes providing the simulated image to a point cloud generator of the set of point cloud generators,
   the set of point cloud generators is configured to generate a plurality of point clouds including a point cloud for the virtual vantage point based on the provided simulated image,
   the point cloud organizer system is configured to consolidate point cloud data from one or more of the plurality of point clouds generated by the set of point cloud generators, the point cloud data corresponding to a surface of an object depicted in the image,
   the voxelizer is configured to generate, based on the consolidated point cloud data for the object, a voxel grid representative of the object, and
   the set of patch renderers is configured to generate a set of rendered patches each depicting at least a part of the surface of the object.

20. The system of claim 18, wherein:
the accessing of the plurality of images includes capturing, by a plurality of physical capture devices disposed at the respective capture vantage points, the plurality of images at the respective capture resolutions; and the representing of the simulated image as a single image includes forming a single image capture system corresponding to the plurality of physical capture devices, the single image capture system providing the simulated image.

* * * * *